(12) United States Patent
Chen et al.

(10) Patent No.: US 11,233,035 B2
(45) Date of Patent: Jan. 25, 2022

(54) PACKAGE STRUCTURE AND METHOD OF MANUFACTURING THE SAME

(71) Applicant: Taiwan Semiconductor Manufacturing Co., Ltd., Hsinchu (TW)

(72) Inventors: Ming-Fa Chen, Taichung (TW); Sung-Feng Yeh, Taipei (TW); Tzuan-Horng Liu, Taoyuan (TW); Chao-Wen Shih, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 50 days.

(21) Appl. No.: 16/886,722

(22) Filed: May 28, 2020

(65) Prior Publication Data
US 2021/0375827 A1  Dec. 2, 2021

(51) Int. Cl.
| H01L 23/12 | (2006.01) |
| H01L 25/065 | (2006.01) |
| H01L 25/00 | (2006.01) |
| H01L 21/56 | (2006.01) |
| H01L 23/367 | (2006.01) |
| H01L 23/31 | (2006.01) |

(52) U.S. Cl.
CPC .......... H01L 25/0657 (2013.01); H01L 21/56 (2013.01); H01L 23/3107 (2013.01); H01L 23/3675 (2013.01); H01L 25/50 (2013.01)

(58) Field of Classification Search
CPC .................................................. H01L 23/5386
See application file for complete search history.

(56) References Cited

U.S. PATENT DOCUMENTS

| 7,285,856 B2 * | 10/2007 | Ooi ...................... H01L 23/145 257/739 |
| 7,696,613 B2 * | 4/2010 | Nakamura ........... H05K 3/4682 257/668 |
| 8,530,751 B2 * | 9/2013 | Maeda ................ H01L 21/4857 174/258 |
| 8,802,504 B1 * | 8/2014 | Hou ..................... H01L 23/5226 438/125 |
| 8,993,380 B2 | 3/2015 | Hou et al. |
| 9,281,254 B2 | 3/2016 | Yu et al. |
| 9,299,649 B2 * | 3/2016 | Chiu ................... H01L 21/4853 |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |
| 2005/0088833 A1 * | 4/2005 | Kikuchi ............ H01L 23/49822 361/763 |

* cited by examiner

Primary Examiner — Thao P Le
(74) Attorney, Agent, or Firm — JCIPRNET

(57) ABSTRACT

A package structure includes a first die, a die stack structure, a support structure and an insulation structure. The die stack structure is bonded to the first die. The support structure is disposed on the die stack structure. A width of the support structure is larger than a width of the die stack structure and less than a width of the first die. The insulation structure at least laterally wraps around the die stack structure and the support structure.

20 Claims, 35 Drawing Sheets

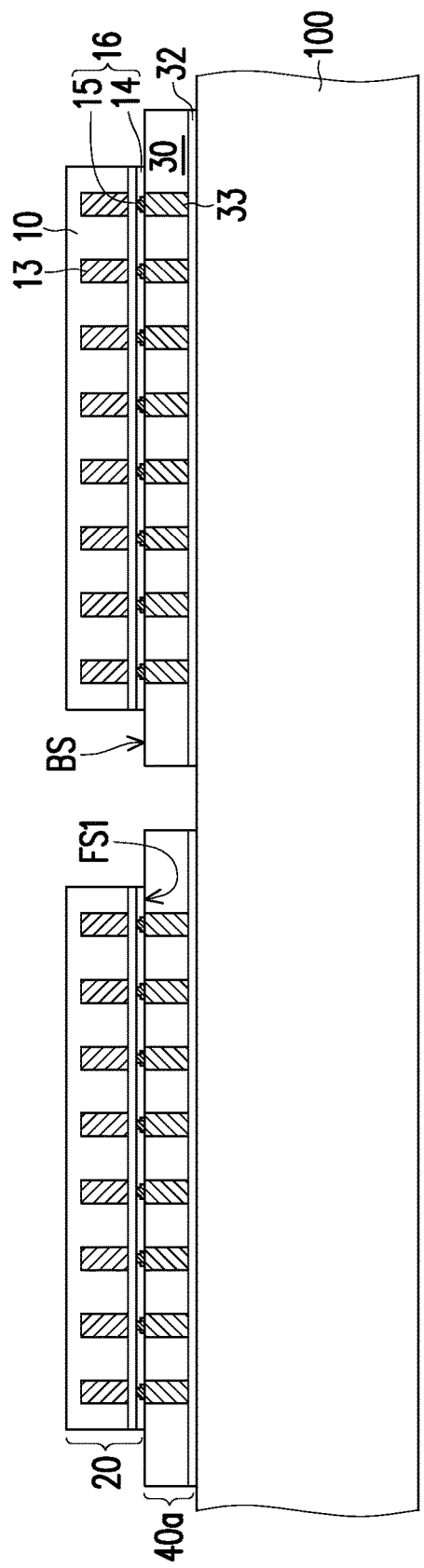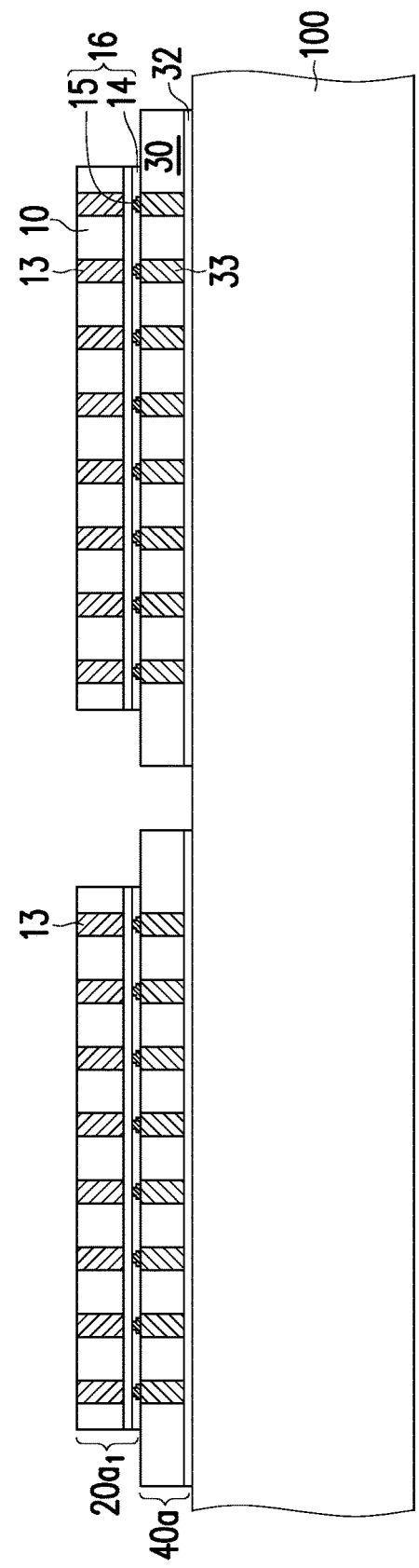

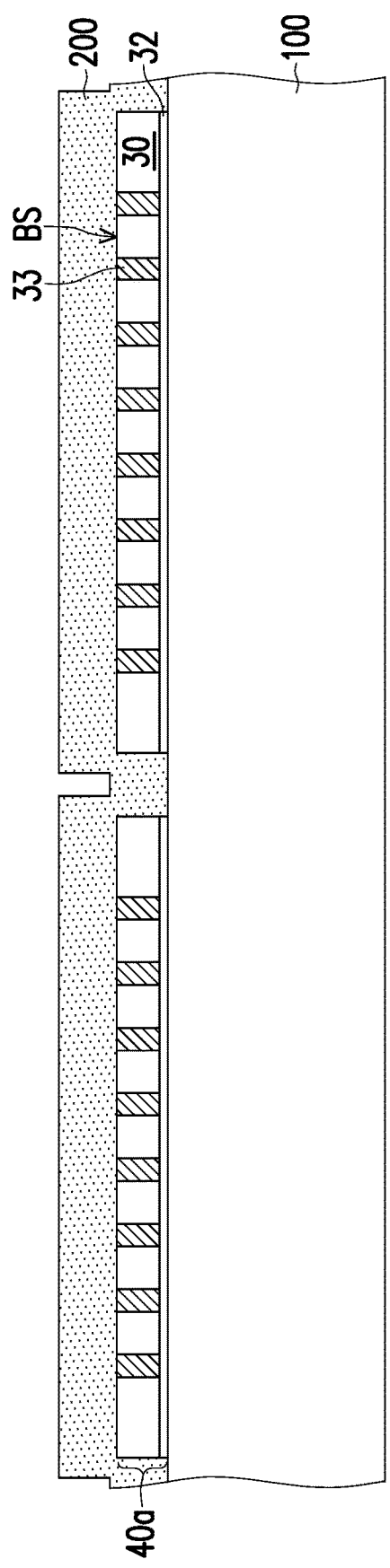
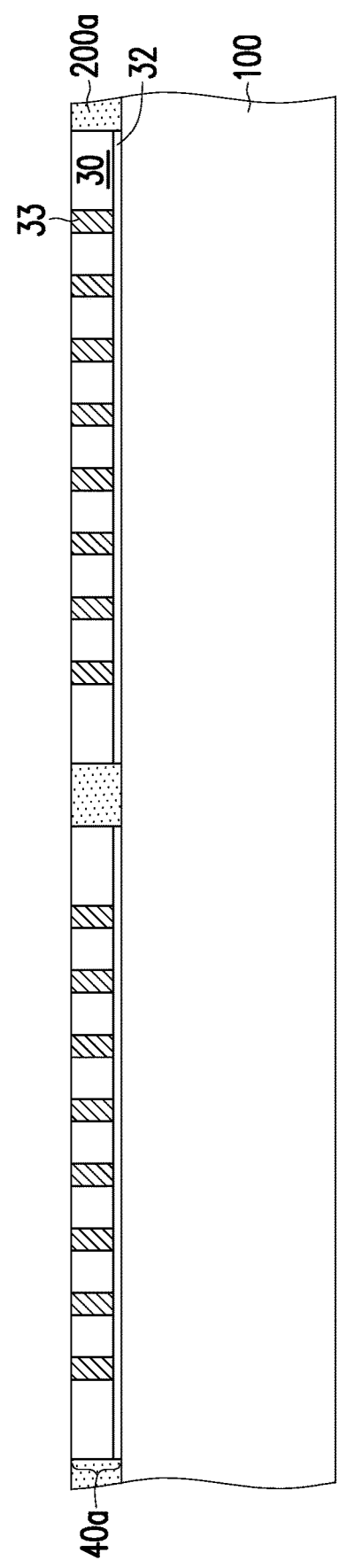
FIG. 5A
FIG. 5B

PACKAGE STRUCTURE AND METHOD OF MANUFACTURING THE SAME

BACKGROUND

The semiconductor industry has experienced rapid growth due to continuous improvements in the integration density of various electronic components (i.e., transistors, diodes, resistors, capacitors, etc.). For the most part, this improvement in integration density has come from continuous reductions in minimum feature size, which allows more of the smaller components to be integrated into a given area. These smaller electronic components also demand smaller packages that utilize less area than previous packages. Some smaller types of packages for semiconductor components include quad flat packages (QFPs), pin grid array (PGA) packages, ball grid array (BGA) packages, flip chips (FC), three-dimensional integrated circuits (3DICs), wafer level packages (WLPs), and package on package (PoP) devices and so on.

3DIC packages provide improved integration density and other advantages. However, there are quite a few challenges to be handled for the technology of 3DICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4A to FIG. 4G are schematic cross-sectional views illustrating a method of forming a semiconductor structure according a first embodiment of the disclosure.

FIG. 5A to FIG. 5G are schematic cross-sectional views illustrating a method of forming a semiconductor structure according to a second embodiment of the disclosure.

DETAILED DESCRIPTION

Figure 1:
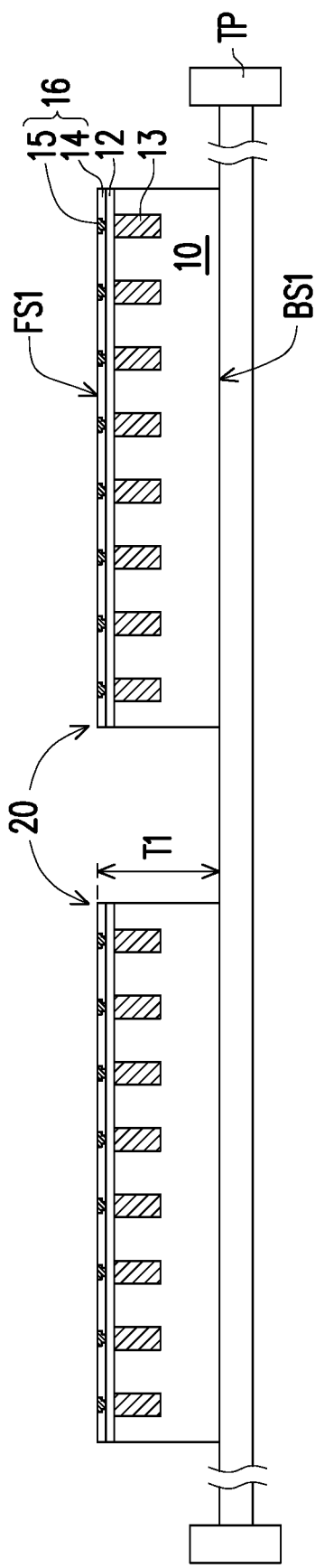
FIG. 1 is a schematic cross-sectional view illustrating the preparation of a die according to some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "above", "upper" and the like, may be used herein for ease of description to describe one element or feature's relationship to another element(s) or feature(s) as illustrated in the FIG.s. The spatially relative terms are intended to encompass different orientations of the device in use or operation in addition to the orientation depicted in the FIG.s. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1 is a schematic cross-sectional view illustrating the preparation of a die for subsequent processes according to a first embodiment of the disclosure. Referring to FIG. 1, a plurality of dies 20 is provided. The dies 20 may be formed in a wafer (not shown). For example, the wafer is processed to include multiple die regions, and then after formation, the wafer may be tested. For example, each die region of the wafer is probed and tested for functionality and performance, and only known good dies (KGDs) are selected and used for subsequently processing. In some embodiments, the wafer is attached to a temporary carrier or a frame including an adhesive tape, and then the wafer is singulated along scribe lines (not shown) to form individual dies 20. For example, the tape frame TP is used for holding the wafer in place during the singulation process.

In some embodiments, the die 20 may be a logic die, a memory die, a radio frequency die, a power management die, a micro-electro-mechanical-system (MEMS) die, a system on chip (SoC), a CPU, a GPU, an xPU, or the like. The die 20 has a front surface (i.e. active surface) FS1 and a back surface BS1 opposite to each other, and has a thickness T1 in a range of about 100 μm to about 600 μm.

In some embodiments, the die 20 includes a substrate 10, an interconnect structure 12, a plurality of conductive vias 13, and a bonding structure 16. For example, the substrate 10 is a semiconductor substrate, such as a bulk semiconductor, a semiconductor-on-insulator (SOI) substrate, a semiconductor on sapphire substrate, other supporting substrate (e.g., quartz, glass, etc.), combinations thereof, or the like, which may be doped or undoped. In some embodiments, the substrate 10 is made of silicon or other semiconductor materials. Alternatively or additionally, the substrate 10 includes other elementary semiconductor materials such as germanium, gallium arsenic, or other suitable semiconductor materials. In some embodiments, the substrate 10 may further include other features such as various doped regions, buried layers, and/or epitaxy layers. Moreover, in some embodiments, the substrate 10 is made of an alloy semiconductor such as silicon germanium, silicon germanium carbide, gallium arsenic phosphide, or gallium indium phosphide.

The semiconductor substrate 10 may include a plurality of devices (not shown) formed therein and/or thereon, and the devices may be or may include active devices (e.g., transistors, diodes, etc.) and/or passive devices (e.g., capacitors, resistors, inductors, etc.), or other suitable electrical components.

The interconnect structure 12 is formed over the substrate 10 and the devices, and includes a dielectric structure and a conductive structure embedded in the dielectric structure. The dielectric structure includes multiple layers of dielectric layers, and the conductive structures include multiple layers of conductive features formed in the dielectric layers. The conductive features are connected to the various devices formed in/on the substrate 10 to form a functional circuit. In some embodiments, the dielectric layers includes an inter-layer dielectric (ILD) layer formed over the substrate 10 and covering the semiconductor devices, and one or more inter-metallization dielectric (IMD) layers formed over the ILD layer. In some embodiments, the ILD layer and the IMD layer are formed of a low-K dielectric material or an extreme low-K (ELK) material, such as an oxide, silicon dioxide, borophosphosilicate glass (BPSG), phosphosilicate glass (PSG), fluorinated silicate glass (FSG), SiOxCy, Spin-On-Glass, Spin-On-Polymers, silicon carbon material, compounds thereof, composites thereof, combinations thereof, or the like. The ILD layer and the IMD layer may include any suitable number of dielectric material layers. The conductive features may be embedded in the dielectric layers, and includes multiple layers of metal lines and vias (not shown). The conductive features may include metal, metal alloy, the like or combinations thereof, such as tungsten (W), copper (Cu), copper alloys, aluminum (Al), aluminum alloys, or combinations thereof. In some embodiments, the interconnect structure 12 further includes a pad and a passivation layer over the dielectric structure and the conductive structure. The pad is electrically connected to the topmost conductive feature of the conductive structure, and the passivation layer may partially cover the pad and expose a portion of the pad for further electrical connection. The pad is a metallic pad, such as aluminum pad. The passivation layer includes a nitride such as silicon nitride.

In some embodiments, the conductive vias 13 are formed in the substrate 10 and electrically connected to the conductive features of the interconnect structure 12. In some embodiments, the conductive via 13 includes a conductive post and a liner (such as the liner DL shown in FIG. 9A) surrounding the sidewalls and bottom surface of the conductive via to separate the conductive post from the substrate. The conductive post may include copper, copper alloys, aluminum, aluminum alloys, Ta, TaN, Ti, TiN, CoW or combinations thereof. The liner may include dielectric material, such as silicon oxide, silicon nitride, or the like. The conductive vias 13 may extend into the interconnect structure 12 to be in physical and electrical contact with the conductive features of the interconnect structure 12. In some embodiments, when the conductive vias 13 are initially formed, the conductive vias 13 are embedded in the semiconductor substrate 10 and may not extend to the back surface BS1 of the substrate 10.

In some embodiments, the bonding structure 16 is formed on and electrically connected to the interconnect structure 12. For example, the bonding structure 16 includes a dielectric layer 14 and a plurality of bonding conductors 15. The dielectric layer 14 includes one or more layers of dielectric materials (e.g. inorganic dielectric materials), such as silicon nitride, silicon oxide, high-density plasma (HDP) oxide, tetra-ethyl-ortho-silicate (TEOS), undoped silicate glass (USG), the like, or a combination thereof.

The bonding conductors 15 are formed in the dielectric layer 14 and electrically connected to the conductive features of the interconnect structure 12, and may further electrically coupled to the devices formed in/on the substrate 10 through the interconnect structure 12, so as to provide an external electrical connection of the die 20. The bonding conductors 15 may be formed of conductive materials such as copper, gold, aluminum, nickel, tungsten, the like, or combinations thereof. The bonding conductors 15 may include bonding pads and/or bonding vias, and may be formed by single damascene process(es) or a dual damascene process. In some embodiments, the bonding conductors 15 may extend into the interconnect structure 12 to be in physical and electrical contact with the pad and/or the topmost conductive feature of conductive structure. The shape and size of the bonding conductor 15 shown in the figures are merely for illustration, and the disclosure is not limited thereto. In some embodiments, the top surfaces of the bonding conductors 15 are substantially coplanar with the top surface of the dielectric layer 14.

FIG. 2A to FIG. 2D are schematic cross-sectional views illustrating various stages of the preparation of a die according to a second embodiment of the disclosure. The die provided in the second embodiment is similar to the first embodiment, except that the die is provided with the conductive vias revealed. Like elements are designated with the same reference numbers for ease of understanding and the details thereof are not repeated herein.

Figure 2A:
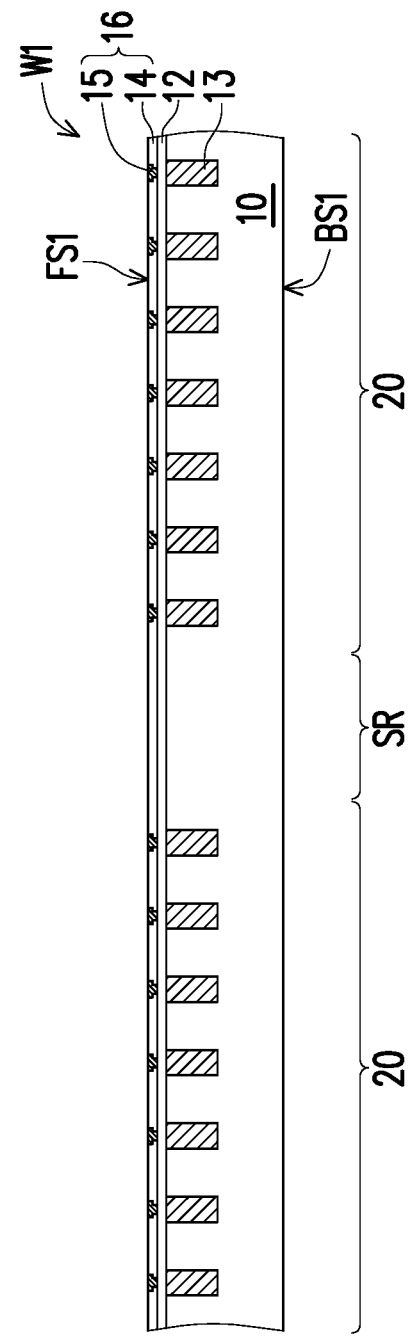
FIG. 2A to FIG. 2D are schematic cross-sectional views illustrating various stages in a manufacturing method of a die according to some embodiments of the disclosure.

Referring to FIG. 2A, a wafer W1 including a plurality of dies 20 is provided. The dies 20 are located in die regions and spaced from each other by scribe regions SR. The configuration of dies 20 is similar to those described in FIG. 1. For example, the die 20 includes the substrate 10, the interconnect structure 12, the conductive vias 13, and the bonding structure 16.

Figure 2B:
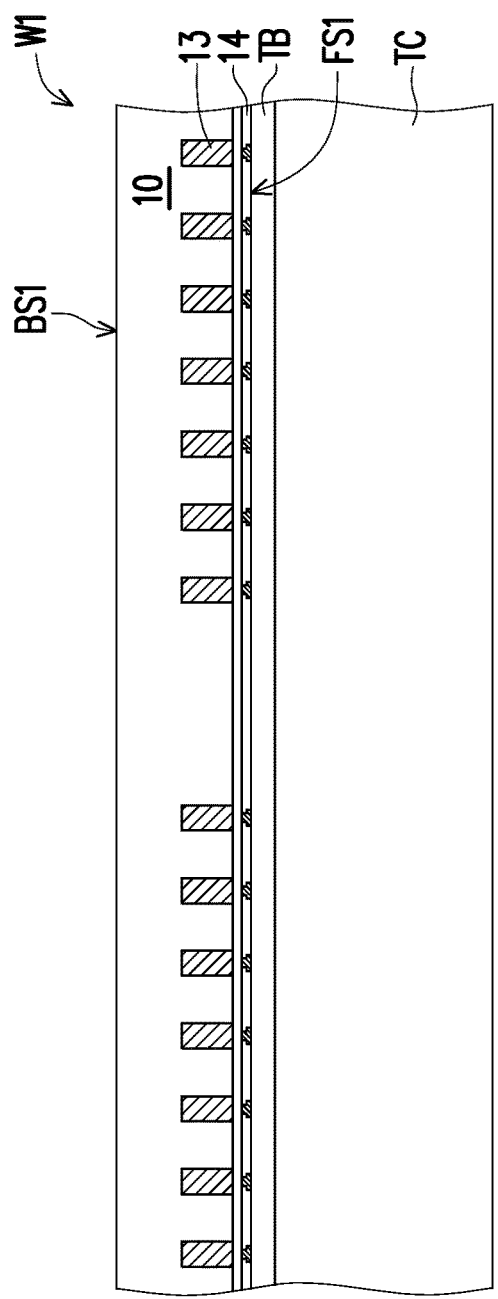

Referring to FIG. 2B, the wafer W1 is placed on a temporary carrier TC. In some embodiments, the wafer W1 is attached to the temporary carrier TC by a temporary bonding layer TB. A material of the temporary carrier TC may include glass, metal, ceramic, silicon, plastic, combinations thereof, multi-layers thereof, or other suitable material that can provide structural support for the wafer W1 in subsequent processing. In some embodiments, the temporary carrier TC is made of glass, and the temporary bonding layer TB includes an adhesive layer (e.g., die attach film (DAF)), a ultra-violet (UV) cured layer, such as a light-to-heat conversion (LTHC) release coating, ultra-violet (UV) glue, which reduces or loses its adhesiveness when exposed to a radiation source (e.g., UV light or a laser). Other suitable temporary adhesives may be used. In some embodiments, the front surface FS1 of the wafer W1 is attached to the temporary carrier TC and the back surface BS1 of the wafer W1 faces upwardly for subsequent processing.

Figure 2C:
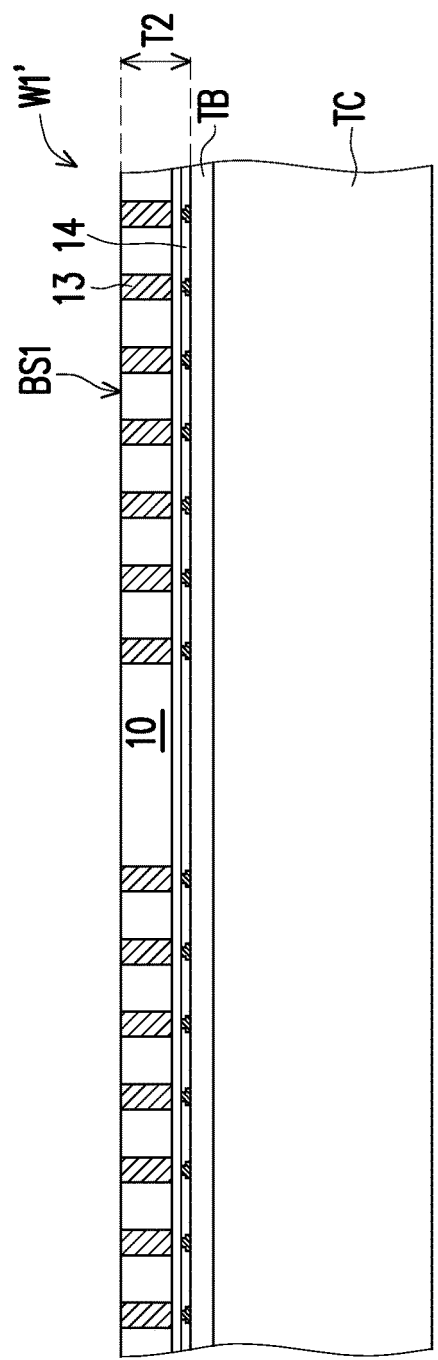

Referring to FIG. 2B and FIG. 2C, the wafer W1 is thinned to form a thinned wafer W1' by, for example, grinding process, chemical mechanical polishing (CMP) process, etching processes, combinations thereof, or other suitable thinning techniques. For example, a thinning process is performed on the backside of the wafer W1 so that the conductive vias 13 are accessibly revealed through the back surface of the substrate 10. Since the conductive vias 13 extend through the substrate 10, the conductive vias 13 may be referred to as through substrate vias (TSVs) or through silicon vias when the substrate 10 is a silicon substrate. In some embodiments, after thinning, the thickness T2 of the thinned wafer W1' is in a range of about 5 μm to about 500 μm or about 40 μm to about 400 μm. The revealed surfaces of the TSVs 13 and the back surface of the substrate 10 constitute the back surface BS1 of the wafer W1'.

Figure 2D:
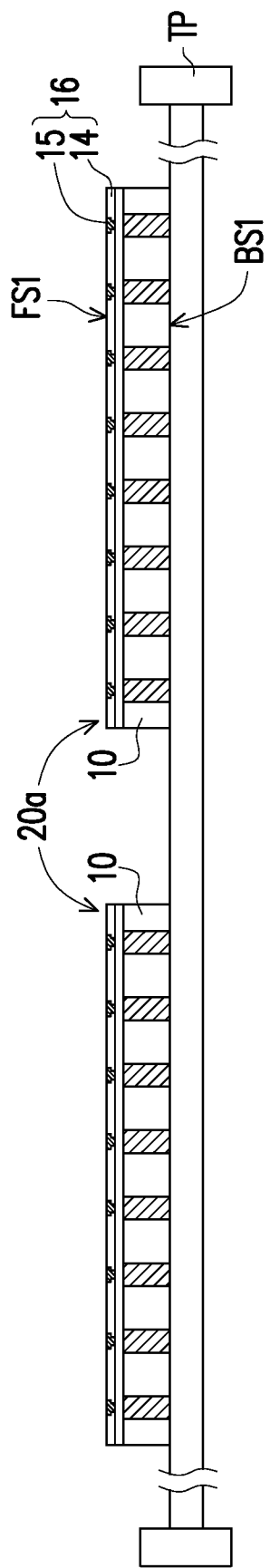

Referring to FIG. 2C and FIG. 2D, after wafer backside thinning, the thinned wafer W1' is mounted on the tape frame TP. In some embodiments, the structure shown in FIG. 2C is turned over, and the back surface BS1 of the die 20a is disposed on the tape frame TP. Next, a de-bonding process is performed to release the temporary carrier TC from the thinned wafer W1'. For example, external energy (e.g., UV light or a laser) is applied on the temporary bonding layer TB to reduce or lose its adhesiveness. In some embodiments, a cleaning process is performed to remove residues of temporary bonding layer TB from the thinned wafer W1 by using suitable solvent, cleaning chemical, or other cleaning techniques. Subsequently, a singulation process is performed on the thinned wafer W1'. For example, the tape frame TP holds the thinned wafer W1 in place during the singulation process, and a dicing tool (e.g., a saw) may be used to cut through the thinned wafer W1 along the scribe regions SR to dice the die regions into a plurality of dies 20a.

In some embodiments, the temporary carrier TC illustrated in FIG. 2B and FIG. 2C may be replaced by a tape frame. For example, the semiconductor wafer WE is mounted on a first tape frame with the front surface FS1 facing towards the first tape frame, and then the thinning process is performed on the backside of the wafer WE until the conductive vias 13 are revealed.

Subsequently, the thinned wafer W1' is transferred to be mounted on the second tape frame TP with the back surface BS1 facing towards the second tape frame, and then the singulation process is performed, and the second tape frame holds the thinned wafer WE in place during the singulation process.

In some embodiments, the dies 20a and the dies 20 described in FIG. 1 are similar in functions and properties, except that the conductive vias 13 of the dies 20 are not revealed, while the dies 20a have been thinned, and the conductive vias 13 thereof are revealed. It should be noted that above examples are provided for illustrative purposes, the formation of the dies 20a can be formed in any logical order which are not limited in the disclosure.

Figure 3A:
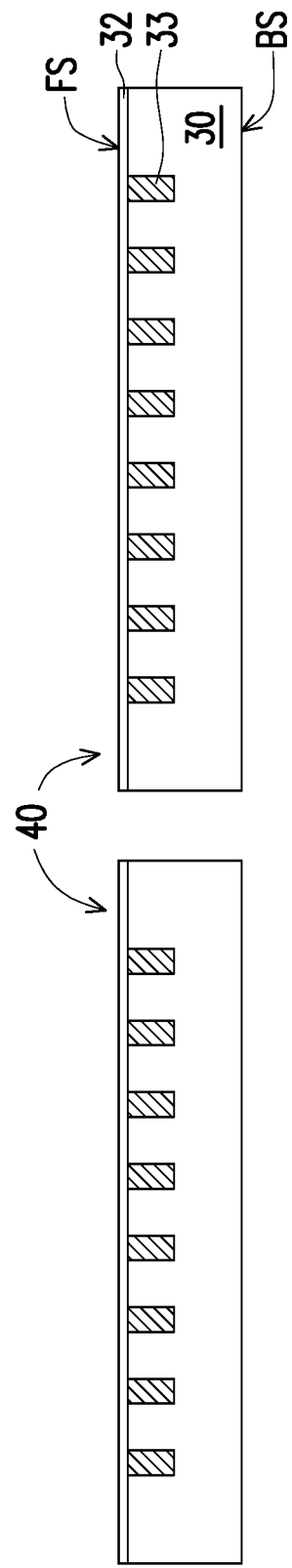
FIG. 3A to FIG. 3C are schematic cross-sectional views illustrating various stages in a manufacturing method of a die according to some embodiments of the disclosure.
Figure 3B:
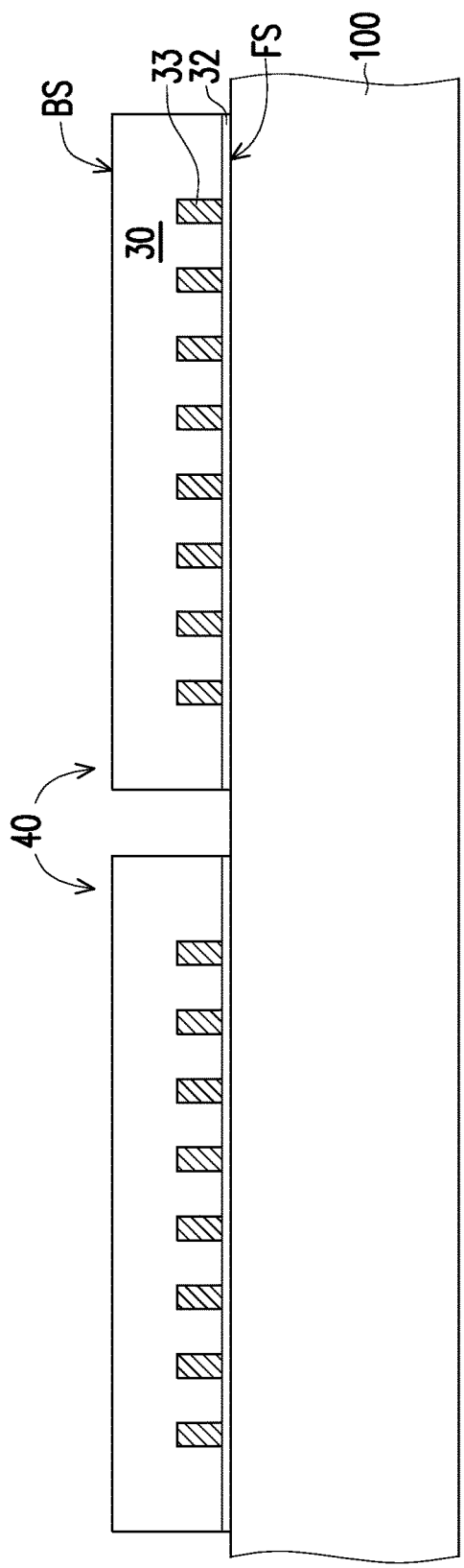
Figure 3C:
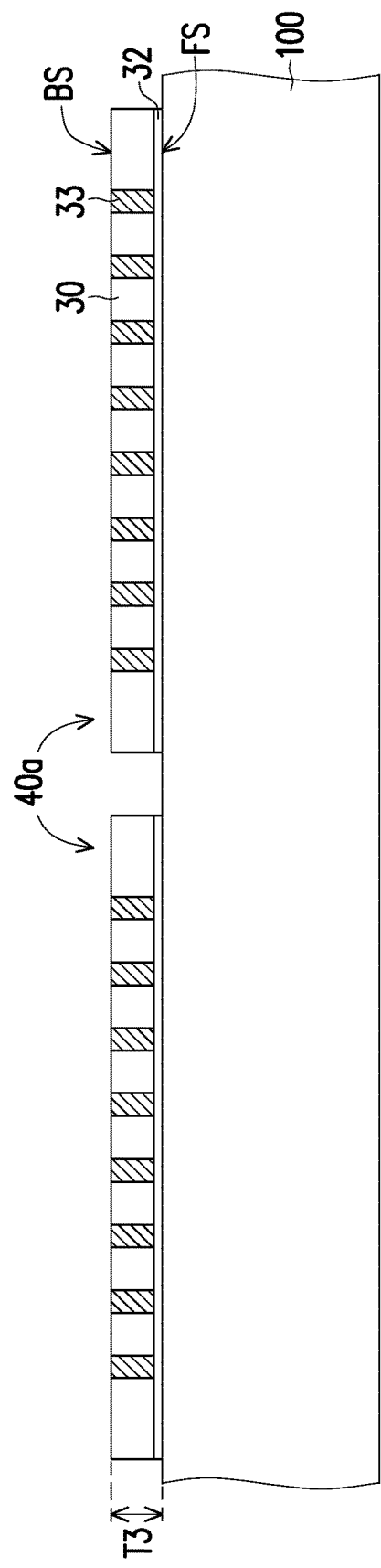

FIG. 3A to FIG. 3C are schematic cross-sectional views illustrating various stages in a manufacturing method of a die according to some embodiments of the disclosure. Referring to FIG. 3A, one or more dies 40 is provided. The die 40 may be a logic die, a memory die, a radio frequency die, a power management die, a micro-electro-mechanical-system (MEMS) die, a system on chip (SoC), a CPU, a GPU, an Xpu, or the like. The die 40 may include a structure similar to the die 20. For example, the die 40 includes a substrate 30, a plurality of conductive vias 33, and an interconnect structure 32, the structural features of which are substantially similar to those of the die 20 (FIG. 1), and are not described again here. The die 40 has the front surface FS and the back surface BS opposite to each other. The dies 40 are cut from a wafer, and the wafer may be probed and tested before singulating. After performing the singulation process, only known good dies 40 are provided for subsequent processes. In some embodiments, the dies 40 are provided without a bonding structure over the interconnect structure 32, but the disclosure is not limited thereto.

In some embodiments, similar to the interconnect structure 12 of the die 20, the interconnect structure 32 of the die 40 also includes a pad and a passivation layer over a dielectric structure and a conductive structure (not shown). The pad is electrically connected to the topmost conductive feature of the conductive structure. In some embodiments, the passivation layer covers the top surfaces and sidewalls of pads, and the pads may be not exposed by the passivation layer at this point. That is, the surface of the passivation layer constitute the front surface FS of the die 40.

In some embodiments, the die 20 and the die 20a and/or the die 40 are singulated from different wafers, and may be different in functions and properties. For example, the die 40 is a logic die (e.g., a system-on-a-chip (SoC), a central processing unit (CPU), a graphics processing unit (GPU), etc.). The die 20 (FIG. 1) or the die 20a (FIG. 2D) may be a memory die (e.g., a dynamic random access memory (DRAM) die, a static random access memory (SRAM) die, a synchronous dynamic random access memory (SDRAM), a NAND flash, etc.).

Referring to FIG. 3B, the dies 40 are disposed on a temporary carrier 100. In some embodiments, a temporary bonding layer (not shown) is deposited on the temporary carrier 100, and the front surface FS of the die 40 is attached to the temporary carrier 100 through the temporary bonding layer. The materials of the temporary carrier 100 and the temporary bonding layer may be similar to those of the temporary carrier TC and the temporary bonding layer TB described above.

Referring to FIG. 3C, a thinning process is performed on the backside of the dies 40 until the conductive vias 33 thereof are accessibly revealed through the substrate 30, and the dies 40a are formed. The thinning process may include a grinding process, a CMP process, etching processes, the like or combinations thereof. After the thinning process, the conductive vias 33 penetrate through the substrate 30 and may be referred to as through substrate vias (TSVs) or through silicon vias when the substrate 30 is a silicon substrate. The top surfaces of the conductive vias 33 and the top surface of the substrate 30 may be substantially coplanar with each other, and together constitute the back surface BS of the die 40a. In some embodiments, the thinned die 40a has a thickness T3 less than 100 µm, such as about 5 µm to about 100 µm. In some embodiments, the thickness T3 is at least about 20 µm.

FIG. 4A to FIG. 4G are schematic cross-sectional views illustrating a method of forming a semiconductor structure according to a first embodiment of the disclosure.

Referring to FIG. 4A, in some embodiments, after the dies 40a are placed on the carrier 100, the dies 20 prepared in FIG. 1 may be removed from the tape frame TP (shown in FIG. 1) to be mounted on the dies 40a, by using, for example, a pick-and-place process or other suitable attaching techniques. In some embodiments, the dies 20 may be thinned by an initial thinning process before picked and placed on the dies 40a. For example, the initial thinning process is performed to reduce the thickness of the die 20 to a range of about 100 µm to about 150 µm, without revealing the conductive vias 13 of the die 20. The dies 20 may be tested before stacked on the dies 40a, so that only known good die (KGD) are used for die stacking. In some embodiments, the die 20 may be disposed on the die 40a in a face-to-back configuration. For example, the front surface FS1 of the semiconductor die 20 face toward the back surface BS of the die 40a. That is, the bonding structure 16 is bonded to the substrate 30 and the conductive vias 33 of the die 40a.

In some embodiments, the dies 20 are bonded to the dies 40 through a bonding process such as, a hybrid bonding process, a fusion bonding process, or a combination thereof. For example, a bonding interface between the die 20 and the die 40 includes metal-to-metal bonding (e.g., copper-to-copper bonding), metal-to-dielectric bonding (e.g., copper-to-oxide bonding), oxide-to-semiconductor bonding (e.g., oxide-to-silicon bonding), dielectric-to-dielectric bonding (e.g., oxide-to-oxide bonding), adhesive bonding, any combinations thereof, and/or the like. For example, the bonding conductors 15 of the die 20 are bonded to the TSVs 33 of the dies 40a through metal-to-metal bonding, and the dielectric layer 14 of the die 20 is bonded to the substrate 30 of the die 40a through dielectric-to-semiconductor bonding.

In some embodiments, the bonding process may be performed as below: first, to avoid the occurrence of the unbonded areas (i.e. interface bubbles), the to-be-bonded surfaces of the dies 20 and the dies 40a (e.g. the front surface FS1 of the die 20 and the back surface BS of the die 40a) are processed to be sufficiently clean and smooth. Then, the dies 20 and the dies 40a are aligned and placed in physical contact at room temperature with slight pressure to initiate a bonding operation. For example, the bonding conductors 15 of the bonding structure 16 are aligned and placed in physical contact with the conductive vias 33, and the dielectric layer 14 of the bonding structure 16 is aligned and in physical contact with the substrate 30 and/or the conductive vias 33. Thereafter, a thermal treatment such as an annealing process at elevated temperatures is performed to strengthen the chemical bonds between the to-be-bonded surfaces of the dies 20 and the dies 40a and to transform the chemical bonds into covalent bonds.

In some embodiments, the dimension (e.g. width) of bonding conductor 15 is smaller than the dimension (e.g. width) of the corresponding conductive via 33, and the dielectric layer 14 of the die 20 immediately adjacent to the bonding conductor 15 may be bonded to a portion of the conductive via 33 of the die 40a. In the present embodiment, the smaller dimension of the bonding conductor 15 may help to prevent the metal of the bonding conductor 15 from diffusing into the substrate 30. However, the disclosure is not limited thereto. In some alternative embodiments, the dimension of the bonding conductor 15 may be equal to or larger than the corresponding conductive via 33.

In alternative embodiments, after the die 40a is thinned, the substrate 30 is further recessed, such that the conductive vias 33 protrudes from the back surface of the substrate 30, an isolation layer is then formed on the back surface of the substrate 30 and laterally aside the conductive vias 33. The isolation layer may include a dielectric material such as silicon nitride. Thereafter, during the bonding process, the dielectric structure 16 of the die 20 is bonded to the conductive vias 33 and the isolation layer of the die 40a, wherein the dielectric layer 14 is bonded to the isolation layer through dielectric-to-dielectric bonding, and the bonding conductors 15 are bonded to the conductive vias 33 through metal-to-metal bonding. In such embodiment, even if the dimension of the bonding conductor 15 is larger than the dimension of the corresponding TSV, the isolation layer may help to present the diffusion of the metal of the bonding conductor 15 into the substrate 30. In some other embodiments, before bonding the die 20 to the die 40a, a bonding structure including a bonding dielectric layer (not shown; e.g., a bonding oxide) and bonding conductors (not shown) are formed on the back surface BS of the die 40a, such that the bonding conductors of two dies are bonded to each other through metal-to-metal bonding, and the bonding dielectric film of one of two dies is bonded to the bonding dielectric film of the other die through dielectric-to-dielectric bonding. It should be noted that bonding methods described above are merely examples and are not intended to be limiting.

Referring to FIG. 4B, in some embodiments in which the dies 20 provided in FIG. 1 are bonded to the dies 40a, a thinning process is further performed on the dies 20, so as to form the dies $20a_1$. For example, the thinning process is performed until the conductive vias 13 are revealed from the substrate 10. After the thinning process, the top surfaces of the conductive vias 13 may be substantially coplanar with the top surface (i.e. back surface) of the substrate 10. The thinning process may include a grinding process, a CMP process, etching process or a combination thereof. In other words, the thinning of the die 20 is performed after the bonding of the dies 20 and the dies 40. In alternative embodiments, the thinned dies 20a formed by the process described in FIG. 2A to FIG. 2D may be used to be bonded to the dies 40a, that is, the thinning process of the dies 20 may be performed before the bonding process. For example, after the dies 20a are formed as shown in FIG. 2D, the dies 20a are removed from the frame tape TP and then bonded to the dies 40a. The bonding of the dies 20a to the dies 40a is substantially similar to the bonding of the dies 20 to the dies 40a as described in FIG. 4A. In some embodiments, the die 20a serve as the first layer of the subsequently formed die stack structure, and therefore be labelled as the die $20a_1$. In some embodiments, the thickness of the die $20a_1$ may range from about 5 µm to about 100 µm, such as 20 µm or 40 µm.

Figure 4C:
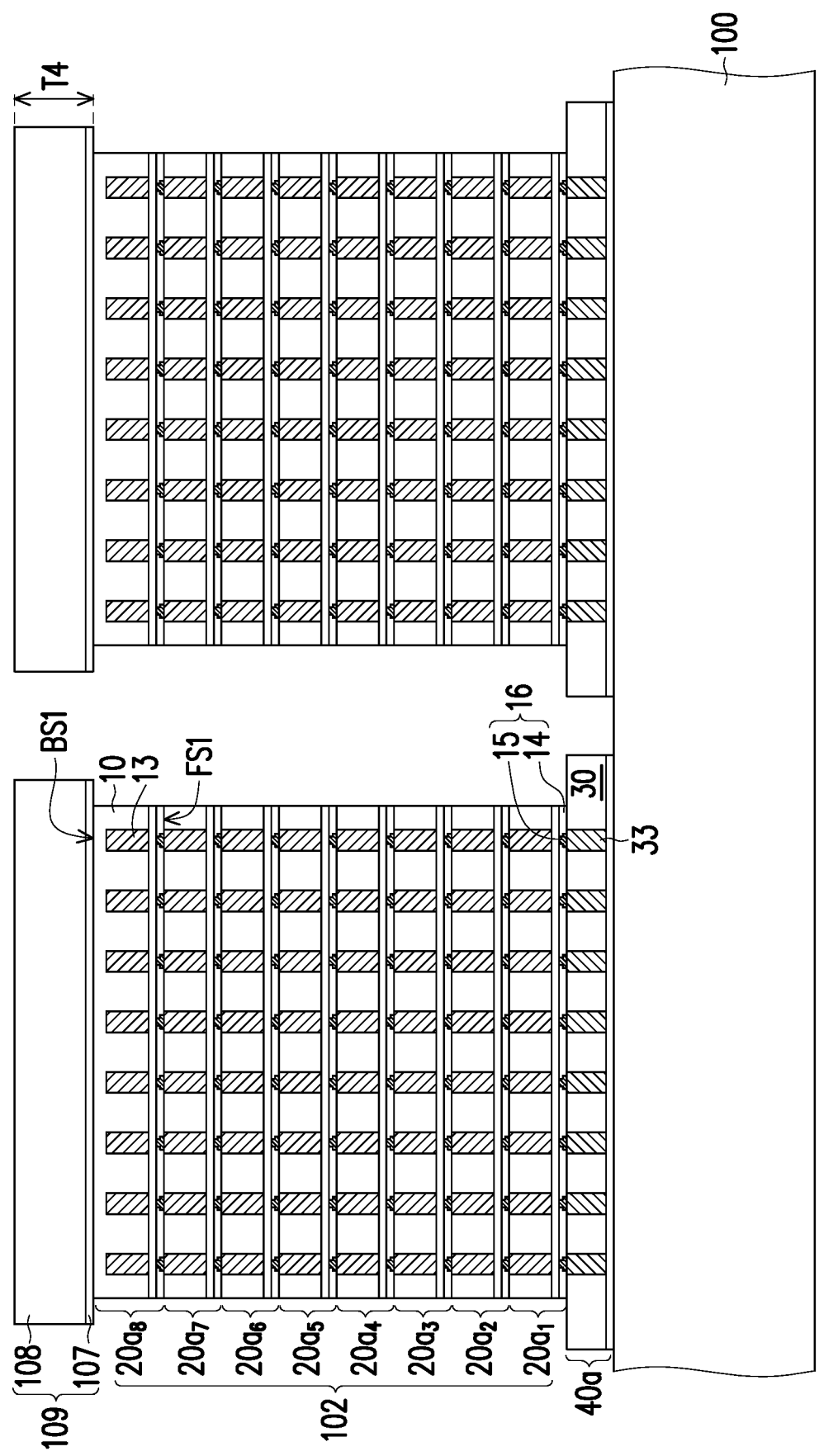

Referring to FIG. 4C, in some embodiments, multiple dies $20a_2$-$20a_7$ are subsequently stacked over the die 40a, and the dies $20a_1$-$20a_7$ form a die stack structure 102. The structures of the dies $20a_2$-$20a_7$ are similar to the structure of the die $20a_1$, which are not described again here. For example, after the die $20a_1$ is bonded to the die 40a, the die $20a_2$ is bonded to the die $20a_1$, and the bonding process of the die $20a_2$ to the die $20a_1$ is similar to that of the die 20a to the die 40a. The die $20a_2$ may be thinned, and the conductive vias 13 thereof are revealed for further electrical connection. The thinning of the die $20a_2$ for revealing the conductive vias 13 may be performed before or after the bonding process, which is similar to those described in FIG. 4A and FIG. 4B.

Thereafter, the bonding process and/or the thinning process are repeated to stack desired layers of dies $20a$ on the die $40a$. In some embodiments, the die $20a_8$ is the topmost die of the die stacked structure 102, and the die $20a_8$ may be provided with the conductive vias 13 embedded in the substrate 10 and not penetrating through the substrate 10. In some alternative embodiments, the topmost die $20a_8$ is provided without conductive vias 13. In some embodiments, the dies $20a_1$-$20a_8$ are stacked on one another in a face-to-back configuration, but the disclosure is not limited thereto. The die stack structure 102 may utilize any suitable configuration such as, face-to-face, face-to-back, back-to-back or combinations thereof. It should be noted that the number of the dies included in the stack structure 102 shown in the figures is merely for illustration, and the disclosure is not limited thereto. For example, the stack structure 102 includes at least one die stacked on the die $40a$. In some embodiments, the stack structure 102 includes at least two dies, and the number of the dies $20a$ include in the stack structure 102 may range from 2 to 64 or more, such as 2, 4, 8, 12, 16 or 64.

Still referring to FIG. 4C, in some embodiments, a support structure 109 is mounted on the die stack structure 102. For example, the support structure 109 is bonded to the topmost die $20a_8$ of the die stack structure 102. The support structure 109 may include a substrate 108 and a bonding film 107, and the support structure 109 is bonded to the die stack structure 102 through the bonding film 107. In some embodiments, the support structure 109 is used to protect the underlying die stack structure 102 and improve the mechanical performance and/or the thermal dissipation performance of the resulted semiconductor structure. In some embodiments, other components such as a lid (such as the lid 301 shown in FIG. 14) may further be disposed over the die stack structure 102. The support structure 109 may provide mechanical support for the components over the die stack structure 102, and serve as a buffer structure between the said components and the die stack structure 102, so as to prevent the stress from the said components directly applying to the die stack structure 102. As such, the damage such as crack of the die stack structure 102 which may be caused by the stress directly form the said components is avoided. In some embodiments, the support structure 109 has a sufficient size (e.g. width, thickness) to reduce the stress from the said components which may be applied on the die stack structure 102. For example, the thickness T4 of the support structure 109 may be in a range of about 50 μm to 200 μm. The width of the support structure 109 may be larger than the width of the die stack structure 102 and less than the width of the die $40a$. The width of the support structure 109 will be discussed in detail later accompanying with the top view.

In some embodiments, the support structure 109 may also have a good thermal conductivity to efficiently conduct heat away from the die stack structure 102, so as to improve the thermal dissipation performance of the resulted semiconductor structure. In some embodiments, the support structure 109 serve as both of the buffer structure and thermal dissipation structure, and suitable materials are selected to form the support structure 109, so as to improve the mechanical performance as well as the thermal dissipation performance of the resulted structure. For example, the Young's modulus of the support structure 109 (or the substrate 108 thereof) is not greater than (such as, less than or equal to) the Young's modulus of the substrate 10 of the die $20a$, and the thermal conductivity of support structure 109 (or the substrate 108 thereof) may be greater than or equal to the thermal conductivity of the substrate 10 of the die $20a$. In some embodiments, the Young's modulus and the thermal conductivity of the substrate 108 of the support structure 109 are close to those of the substrates 10 of the dies $20a_1$-$20a_8$.

In some embodiments, the substrate 108 of the support structure 109 may include a material the same as or different from the material of the substrates 10 of the dies $20a_1$-$20a_8$. For example, the substrate 108 includes a semiconductor material, such as silicon chip, or thin copper or aluminum plate. In some embodiments, the substrate 108 of the support structure 109 may be a blank silicon die cut form a wafer, and the support structure 109 may also be referred to as a dummy die structure. The blank silicon die is free of active or passive devices formed therein. Furthermore, the blank silicon die may not have any metal lines, vias, etc. formed therein. In addition, the material of the substrate 108 may be homogenous. For example, the entire substrate 108 of the support structure 109 may be formed of the same material, which includes same elements in all parts of the substrate 108, and the atomic percentages of the elements may be uniform throughout the substrate 108. In some other embodiments, the substrate 108 may include a material different from those of the substrates 10 of the dies $20a_1$-$20a_8$. Other suitable materials may also be used, as long as the support structure 109 can provide the mechanical property and the thermal dissipation property as described above.

In some embodiments, the bonding film 107 is formed on the substrate 108 by a deposition process, such as chemical vapor deposition (CVD), before performing the bonding of the support structure 109 to the die stack structure 102. The bonding film 107 includes a dielectric material such as an oxide (e.g. silicon oxide), undoped silicate glass (USG), tetraethyl ortho-silicate (TEOS), the like, or combinations thereof. In some embodiments in which the substrate 108 is a blank die cut from a wafer, the bonding film 107 may be formed on the wafer, and the wafer having bonding film thereon is singulated to form individual support structures 109.

After the bonding film 107 is formed on the substrate 108, the support structure 109 having the bonding film 107 is bonded to the die stack structure 102. For example, the bonding film 107 is bonded to the back surface BS1 of the die $20a_8$ through a fusion bonding process, and a dielectric-to-semiconductor bonding interface is formed between the bonding film 107 of the support structure 109 and the substrate 10 of the die $20a_8$. In some other embodiments, before the bonding process, a dielectric bonding film may further be formed on back surface of the die $20a_8$, and the bonding film 107 is bonded to the dielectric bonding film on the die $20a_8$ through fusion bonding, hence a dielectric-to-dielectric bonding interface may be formed between the support structure 109 and the die $20a_8$. In alternative embodiments, the support structure 109 may merely include the substrate 108 and is free of bonding film 107, and the dielectric bonding film is formed on back surface of the die $20a_8$ to be bonded to the substrate 108.

Figure 4D:
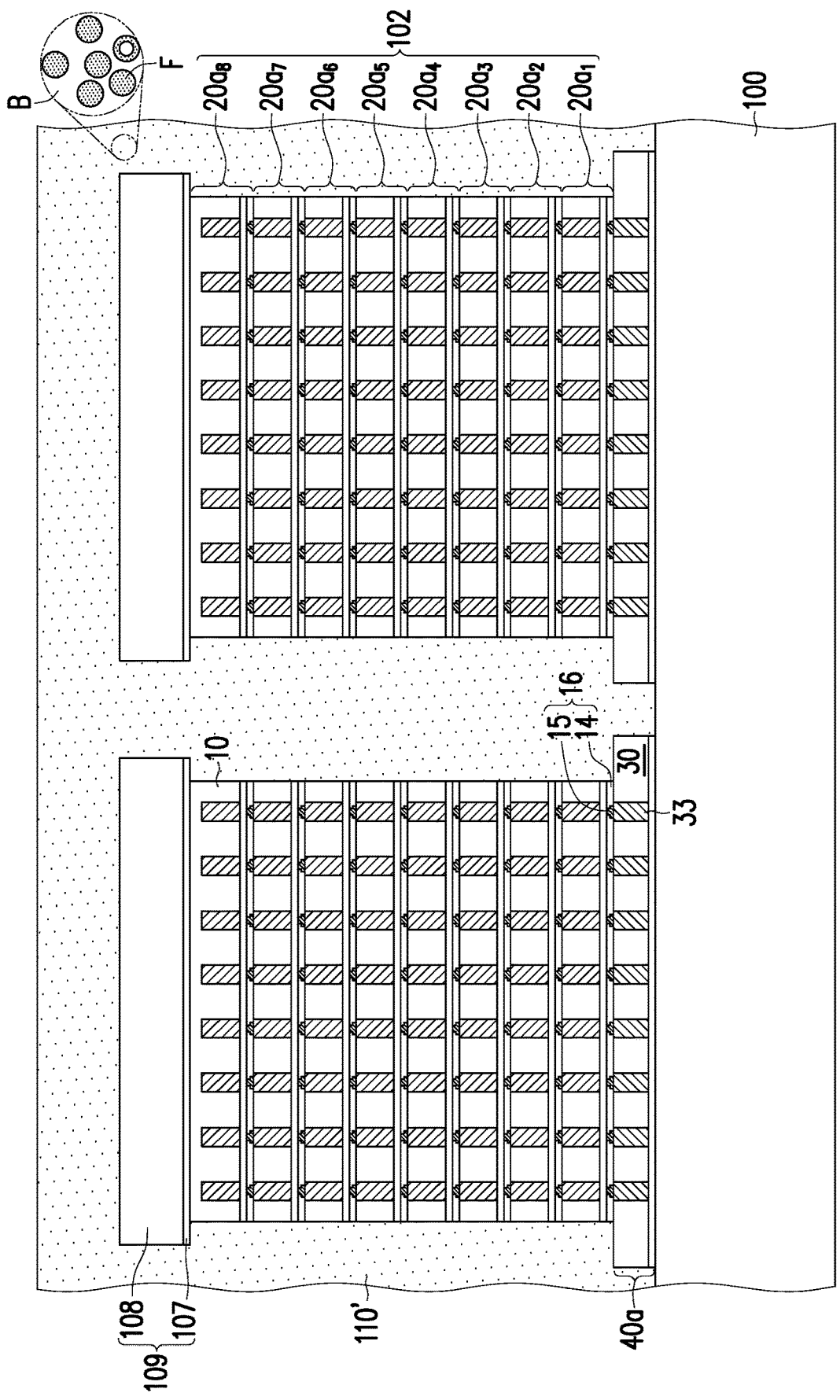

Referring to FIG. 4D, in some embodiments, an encapsulant material layer 110' may be formed over the carrier 100 by an over-molding process. The encapsulant material layer 110' has a substantially planar top surface higher than the top surface of the support structure 109, so as to encapsulate top surfaces and sidewalls of the die $40a$, the die stack structure 102 and the support structure 109. The encapsulant material layer 110' may include a molding compound, a molding underfill, a resin such as epoxy, a combination thereof, or the like. In some other embodiments, the encapsulant material layer 110' includes a photo-sensitive material such as polybenzoxazole (PBO), polyimide (PI), benzocyclobutene (BCB), a combination thereof, or the like. In alternative embodiments, the encapsulant material layer 110' includes nitride such as silicon nitride, oxide such as silicon oxide, phosphosilicate glass (PSG), borosilicate glass (BSG), boron-doped phosphosilicate glass (BPSG), a combination thereof, or the like.

In some embodiments, the encapsulant material layer 110' is a molding compound which is a composite material including a base material B and a plurality of fillers F in the base material B. In some embodiments, the encapsulant material layer 110' may further include additives, such as hardener. The base material B may include resins, such as epoxy resins, or the like. The fillers F may include a single element, a compound such as nitride, oxide, or a combination thereof. The fillers F may include silicon oxide, aluminum oxide, boron nitride, alumina, silica, or the like, or combinations thereof, for example. In some embodiments, the fillers F are spherical particles, or the like. The cross-section shape of the filler F may be circle, oval, or any other suitable shape. In some embodiments, the fillers F are solid fillers, but the disclosure is not limited thereto. In some embodiments, a small portion of the fillers F may be hollow fillers.

Figure 4E:
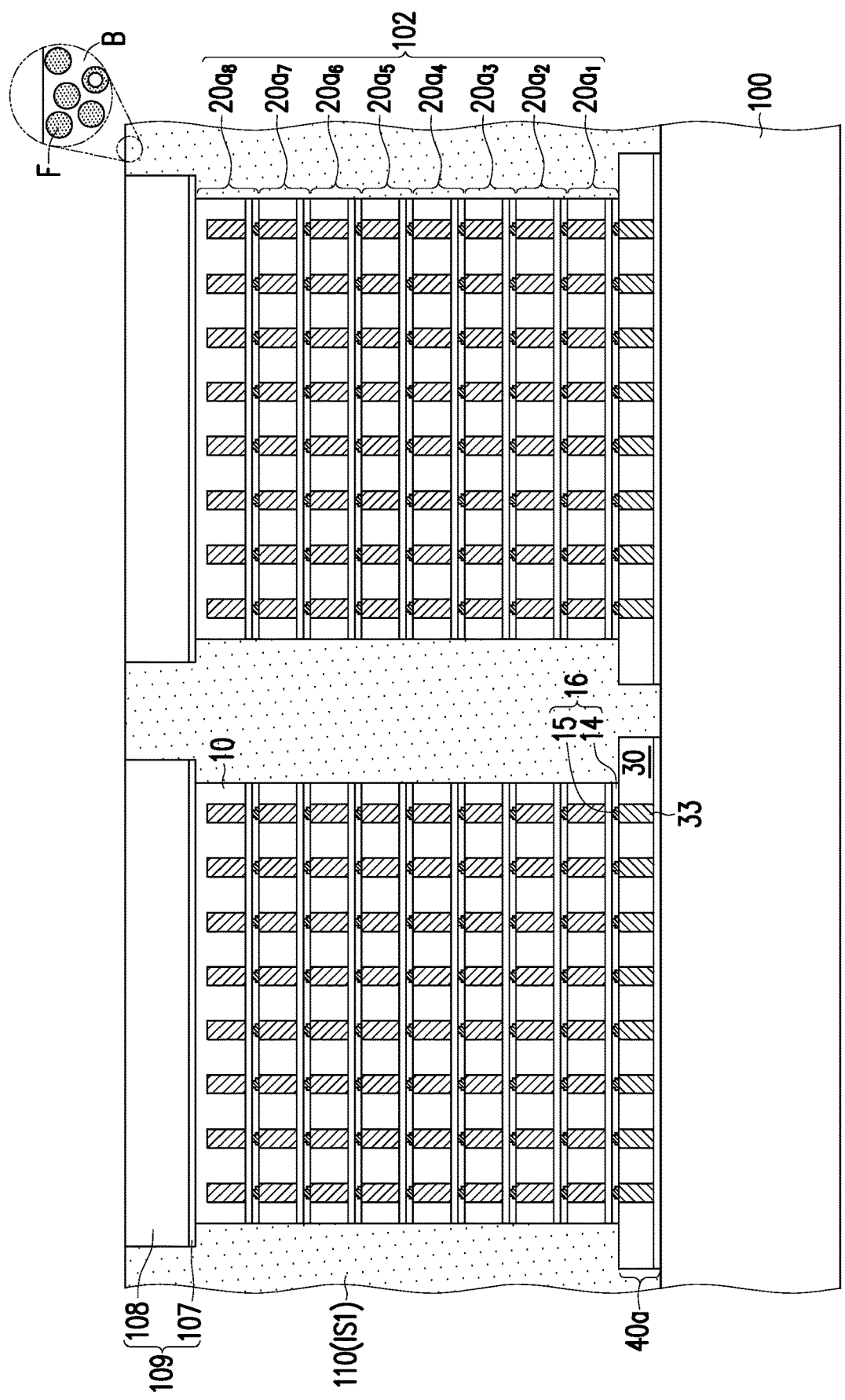

Referring to FIG. 4D and FIG. 4E, a planarization process such as a grinding process, a CMP process or a combination thereof, is performed to remove the encapsulant material layer 110' over the top surface of the support structure 109, so as to form the encapsulant 110. In some embodiments, the top surface of the encapsulant 110 is substantially coplanar with the top surface of the support structure 109. The encapsulant laterally encapsulating the dies 40a, the die stack structure 102, and the support structure 109. In some embodiments, the encapsulant 110 may also be referred to as an insulation structure IS1.

In the present embodiment, the encapsulant 110 is formed after the support structure 109 has been bonded to the die stack structure 102, and the dimension of the support structure 109 is configured as larger than the dimension of the die stack structure 102 and less than the dimension of the die 40a, such that the encapsulant material can enter into the space between the support structure 109 and the die 40a to laterally encapsulate the die stack structure 102. In some embodiments, forming the encapsulant 110 after the bonding of the support structure 109 has some advantages. For example, if the encapsulant is firstly formed laterally aside the die stack structure 102, and the support substrate 109 is subsequently bonded to the die stack structure 102 and the encapsulant by fusion bonding process, the organic material of encapsulant may be unable to be fusion bonded to the inorganic material of the bonding film 107 very well.

Figure 4F:
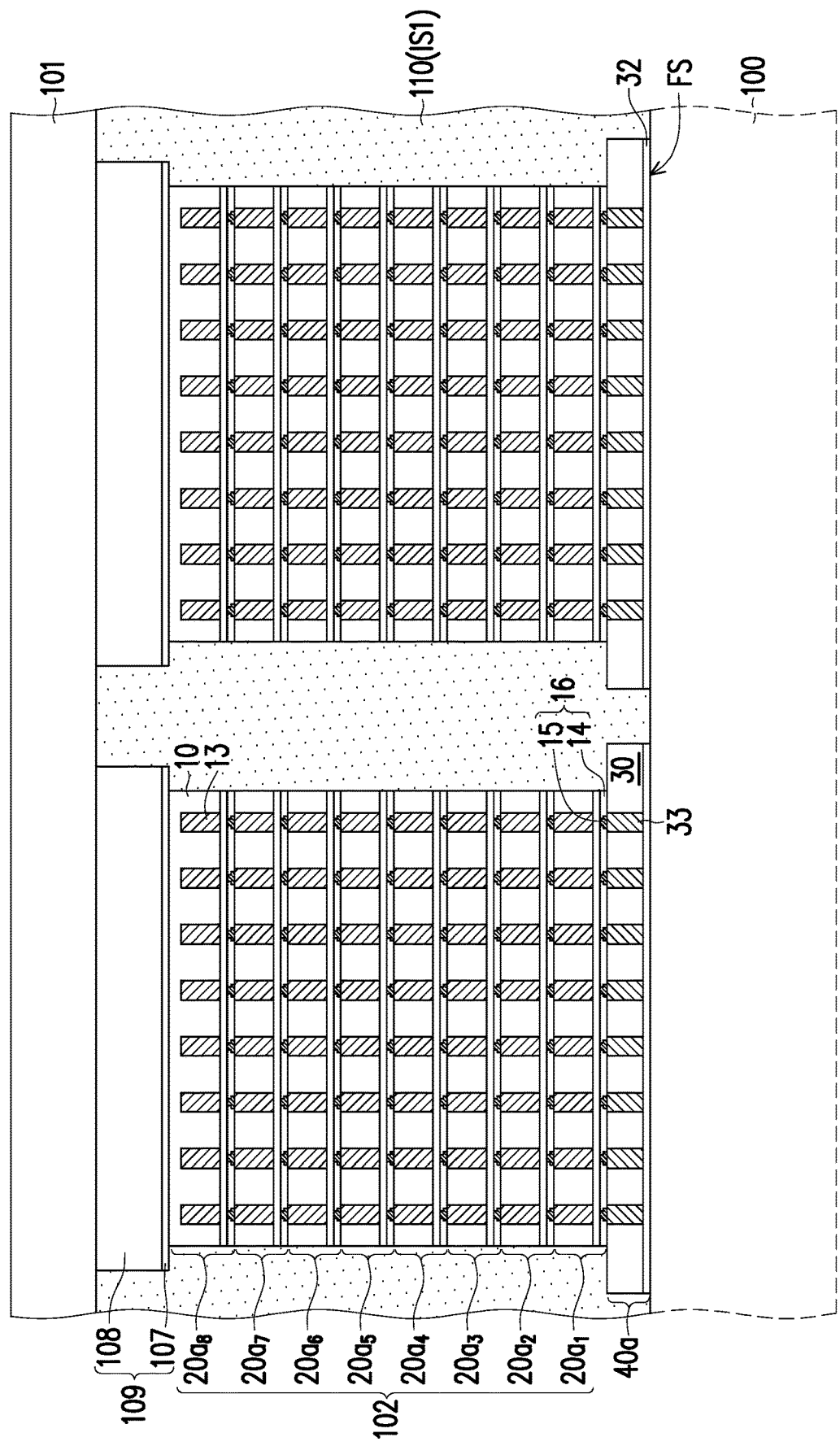

Referring to FIG. 4F, another temporary carrier 101 is optionally attached to the insulation structure IS1 and the support structure 109 opposite to the temporary carrier 100. A de-bonding process is performed to release the temporary carrier 100 form the overlying structure, such that the front surface FS of the die 40a is exposed. In some embodiments, after the de-bonding of the temporary carrier 100, the front surface FS of the die 40a is cleaned for further processing.

Figure 4G:
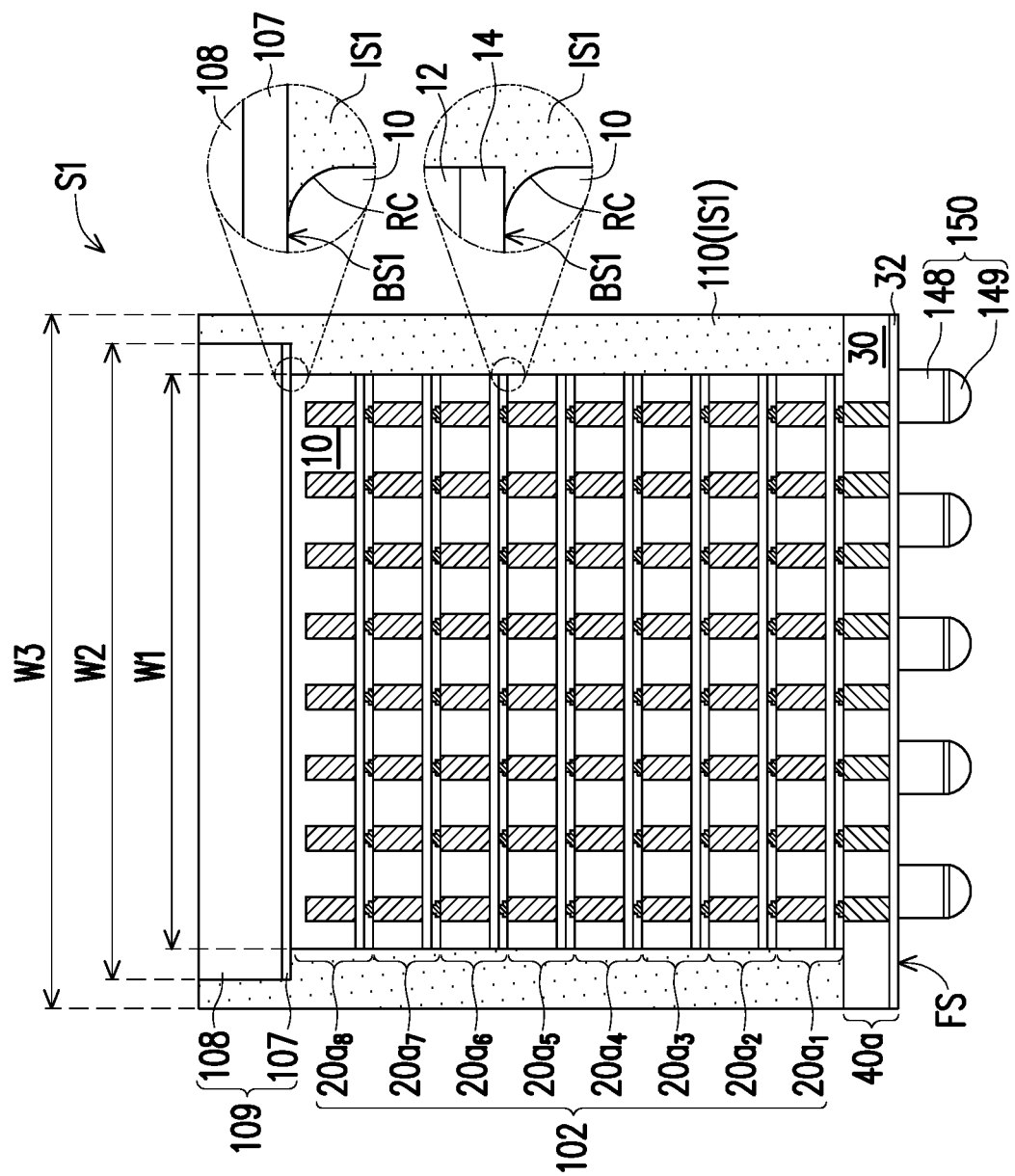

Referring to FIG. 4F and FIG. 4G, after removing the temporary carrier 100, the front surface FS of the die 40a is exposed. A plurality of conductive terminals 150 may be subsequently formed on the front surface FS of the die 40a to electrically connect to the die 40a and the die stack structure 102. In some embodiments in which the interconnect structure 32 including the passivation layer (not shown) covering the pads (metal features), a portion of the passivation layer is removed to form openings. The openings of the passivation layer may accessibly expose at least a portion of the underlying metal feature. Next, the conductive terminals 150 may be formed in the openings of the passivation layer to be in electrical contact with the metal features of the interconnect structure 32 by using, for example, a sputtering, printing, plating, deposition, or the like. The conductive terminals 150 may be formed of conductive material(s) including copper, aluminum, gold, nickel, silver, palladium, tin, solder, metal alloy, the like, or combinations thereof. Alternatively, before forming the conductive terminals 150, other processes may be performed at the front surface FS of the die 40a depending on the design requirements.

For example, the conductive terminal 150 includes a conductive bump 148. The conductive bump 148 may be a micro-bump, a metal pillar, an electroless nickel-electroless palladium-immersion gold (ENEPIG) formed bump, a controlled collapse chip connection (C4) bump, a ball grid array (BGA) bump, or the like. The conductive bumps 148 may be solder free and may have substantially vertical sidewalls. In some embodiments, each of the conductive terminals 150 includes a metal cap 149 formed on the top of the conductive bump 148 by, for example, plating, printing, or the like. For example, a material of the metal caps 149 includes nickel, tin, tin-lead, gold, silver, palladium, nickel-palladium-gold, nickel-gold, the like, or any combination of these.

In some embodiments, after forming the conductive terminals 150, the temporary carrier 101 (shown in FIG. 4F) is de-bonded from the insulation structure IS1 and the support structure 109. Subsequently, a singulation process is performed to form a plurality of semiconductor structures S1. The singulation may be performed along scribe lines (not shown) by, for example, a sawing, laser cutting, or the like or combinations thereof. In some embodiments, the sidewalls of the die 40a are exposed by the insulation structure IS1 after singulation, but the disclosure is not limited thereto. In alternative embodiments, the sidewalls of the die 40a may be covered by the insulation structure IS1.

Referring to FIG. 4G, as such, a semiconductor structure S1 is thus formed. The semiconductor structure S1 may also be referred to as a package structure, such as a three-dimensional integrated circuit (IC) package. In some embodiments, the semiconductor structure S1 includes the die 40a, the die stack structure 102, the support structure 109, the insulation structure IS1 and the conductive terminals 150. The top surface of die stack structure 102 may be (completely or partially) covered by the support structure 109. The die stack structure 102 includes a plurality of dies (such as, the dies 20a₁-20a₈) electrically connected to the die 40a. In some embodiments, the die 40a is, for example, a logic die configured to perform read, program, erase, and/or other operations, and the die stack structure 100 is, for example, a memory stack including memory dies stacked upon one another and programmed by the die 40a. in some embodiments, the height of the semiconductor structure S1 from the top surface of the support structure 109 to the bottom surface of the die 40a may be in a range of about 500 μm to about 780 μm.

The support structure 109 is disposed on the die stack structure 102 to improve the mechanical performance and thermal dissipation performance of the semiconductor structure S1. In some embodiments, the insulation structure IS1 is disposed on the die 40a and laterally wrapping around the die stack structure 102 and the support structure 109. In some embodiments, the insulation structure IS1 is a single-layer structure and includes an encapsulant 110 laterally encapsulating the die stack structure 102 and the support structure 109. The sidewalls of the isolation structure IS1 may be aligned with the sidewalls of the die 40a. In some embodiments, the sidewalls and a portion of the bottom surface of the support structure 109 are covered by and in physical contact with the insulation structure IS1, and the top surface of the support structure 109 is substantially coplanar with the top surface of the insulation structure IS1.

Figure 12A:
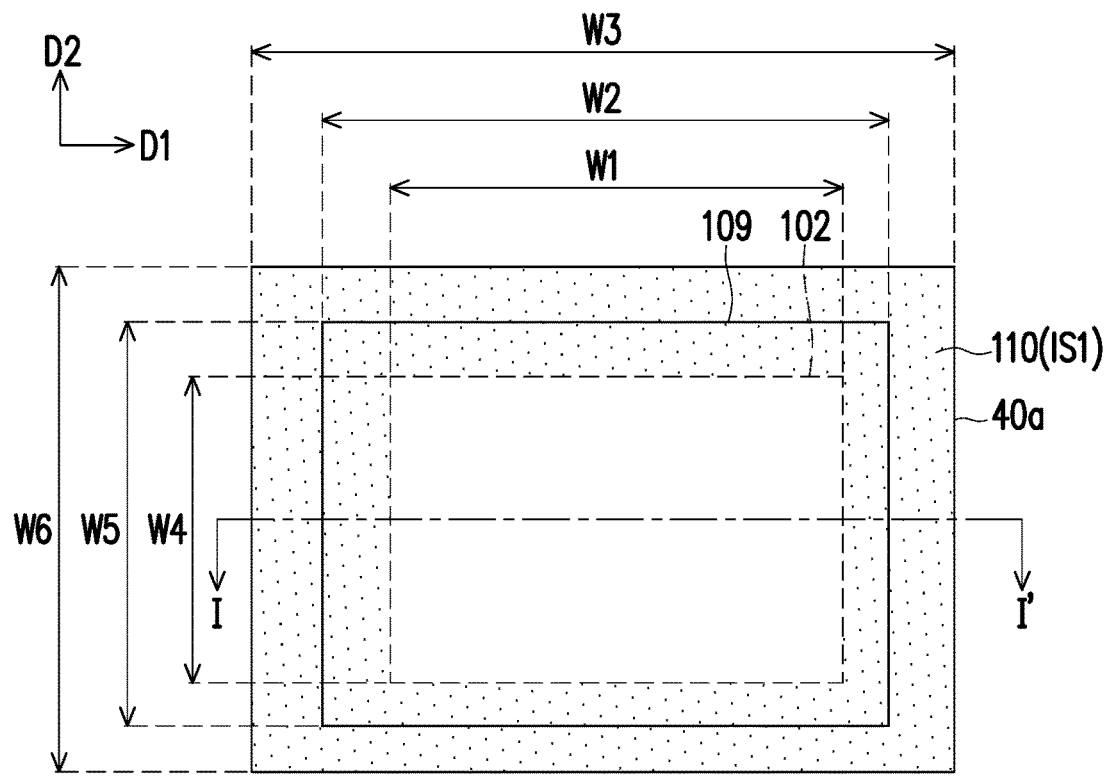
FIG. 12A and FIG. 12B are top views of semiconductor structures according to some embodiments of the disclosure.
Figure 12B:
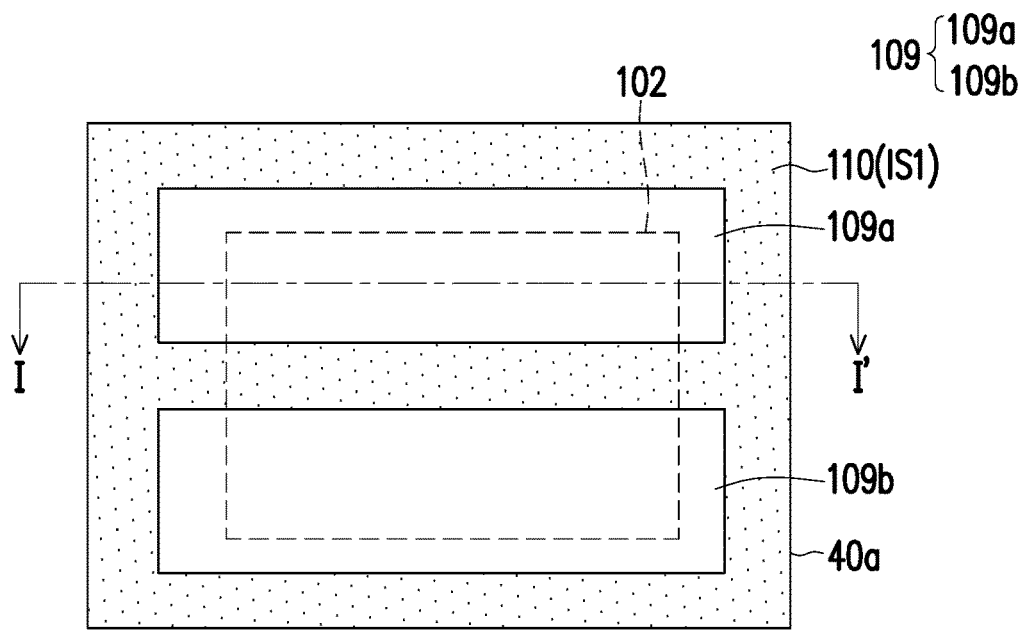

FIG. 12A and FIG. 12B illustrates top views of the semiconductor structure S1 according to some embodiments of the disclosure, and FIG. 4G is cross-section view along I-I' line of FIG. 12A and FIG. 12B. For sake of brevity, the conductive terminals 150 are not shown in the top views.

Referring to FIG. 4G and FIG. 12A, the die stack structure 102 is vertically between the die 40a and the support structure 109. In some embodiments, the sidewalls of the dies $20a_1$-$20a_8$ included in the die stack structure 102 are substantially aligned with each other. The sidewalls of the support structure 109, the die stack structure 102 and the die 40a may laterally offset from each other. For example, the die 40a laterally extends beyond sidewalls (or edges) of the die stack structure 102 and sidewalls (or edges) of the support structure 109, and the support structure 109 laterally extends beyond sidewalls (or edges) of the die stack structure 102. When viewed in the top view, the sidewalls of the support structure 109 may be located laterally between the corresponding sidewalls of the die stack structure 102 and the sidewalls of the die 40a (or the encapsulant 110) in a lateral direction parallel with a top surface of the die stack structure 102. In some embodiments, the support structure 109 laterally extends beyond at least two opposite sidewalls of the four sidewalls of the die stack structure 102.

In other words, the die 40a has a larger dimension (e.g. width or area) than the die stack structure 102 and the support structure 109, and the dimension of the support structure 109 may be larger than the dimension of the die stack structure 102 and less than the dimension of the die 40a. In some embodiments, from the top view, the shapes of the die 40a, the die stack structure 102 and the support structure 109 may respectively be square, rectangular, the like, or any suitable shapes.

For example, each of the support structure 109, the die stack structure 102 and the die 40a includes two pairs of opposite sidewalls respectively extending along the first direction D1 and the second direction D2. The first direction D1 and the second direction D2 are perpendicular to each other, for example. The die stack structure 102 has a first width W1 in the first direction D1 and a second width W4 in the second direction D1. The support structure 109 has a first width W2 in the first direction D1 and a second width W5 in the second direction D2. The die 40a has a first width W3 in the first direction D1 and a second width W6 in the second direction D2. For example, in the same direction D1 or D2, the first and second width W3/W6 of the die 40a are larger than the corresponding first and second width W2/W5 of the support structure 109 and the corresponding first and second width W1/W4 of the die stack structure 102, respectively. At least one of the first and second width W2/W5 of the support structure 109 is larger than the corresponding first and/or second width W1/W4 of the die stack structure 102. In some embodiments, both of the first and second width W2/W5 of the support structure 109 are larger than the corresponding first and second width W1/W4 of the die stack structure 102. For example, the ratio (W1:W2:W3) of the width W1 of the die stack structure 102 to the width W2 of the support structure 109 to the width W3 of the die 40a may range from 1:2:2.5. the ratio (W4:W5:W6) of the width W4 of the die stack structure 102 to the width W5 of the support structure 109 to the width W6 of the die 40a may range from 1:2:2.5.

In some other embodiments, the support structure 109 may include a plurality of discrete partitions. For example, as shown in FIG. 12B, the support structure 109 may include a first support structure 109a and a second support structure 109b configured as side by side on the die stack structure 102. Each of the first support structure 109a and the second support structure 109b may have a cross-sectional structure as shown in FIG. 4G. In such embodiment, the insulation structure IS1 is further disposed between the first support structure 109a and the second support structure 109b, and a portion of the top surface of the die stack structure 102 is covered by and in contact with the insulation structure IS1 laterally between the first and second support structures 109a and 109b. It should be understood that, the size, configuration and the number of the support structures illustrated in the top views are merely for illustration, and the disclosure is not limited thereto. In alternative embodiments, more than two support structures having any suitable sizes are disposed on the die stack structure in any suitable configuration, as long as the support structures provide the mechanical property and the thermal dissipation property as described above.

Referring to FIG. 4G, in some embodiments, the dies of the die stack structure 102 may have a corner which is a right angle, or a rounding corner. For example, one or more of the dies $20a_1$-$20a_8$ of the die stack structure 102 may have rounding corners RC or rounding edges. In some embodiments, the rounding corners RC may be created during the backside thinning process (e.g., the step described in conjunction with FIG. 4B). For example, the grinding pad, which is in contact with the edges of the semiconductor dies, makes the edges of the semiconductor dies rounded. Alternatively, the rounding corner RC is created by continuous and perimeter cutting during the singulation process.

The rounding corner RC is connected to the back surface BS1 and sidewalls of the corresponding die. The back surface BS1 of the die may be in contact with the dielectric layer 14 of an overlying die or the support structure 109. In some embodiments, the bottom surface of the dielectric layer 14 and the bottom surface of the support structure 109 are substantially flat, and a gap is formed between the bottom surface of the dielectric layer 14 of the corresponding die and the rounding corner RC and/or between the bottom surface of the support structure 109 and the rounding corner RC. In such embodiments, the insulation structure IS1 may fill into the gap(s) to cover the rounding corner RC and a portion of the bottom surface of the dielectric layer 14 of the corresponding die and/or cover the rounding corner RC and a portion of the bottom surface of the support structure 109. In other words, a portion of the insulation structure IS1 may be vertically sandwiched between the adjacent two dies of the die stack structure 102, and/or vertically sandwiched between the topmost die of the die stack structure 102 and the support structure 109.

In some embodiments, the dies having the rounding corners RC may be advantageously used in device package configurations. For example, since stress (e.g. thermal and/or mechanical stress) is highest at boundaries and at corners and edges of the die in a stack structure, the corners and edges of the die are the highest stress locations and are prone to cracking. By forming the rounding corners RC, the dies may spread out the stress in the edge/corner area.

FIG. 5A to FIG. 5G are cross sectional views illustrating a method of forming a semiconductor structure according to a second embodiment of the disclosure, the second embodiment differs from the first embodiment in that the insulation structure is a combination of a dielectric structure (e.g. inorganic dielectric structure) and encapsulant, the details are described as below.

Referring to FIG. 3C and FIG. 5A, in some embodiments, after the dies 40a are mounted on the carrier 100, a dielectric material layer 200 is formed on the carrier 100 to cover sidewalls and top surfaces (such as, back surfaces BS) of the dies 40a. The conductive via 33 of the dies 40a may have been revealed before forming the dielectric material layer 200, but the disclosure is not limited thereto. In some embodiments, the dielectric material layer 200 includes inorganic dielectric material, such as oxide (e.g. silicon oxide), nitride (e.g. silicon nitride), oxynitride (e.g. silicon oxynitride), silicon carbonitride (SiCN), silicon carbon oxide (SiCO), or combinations thereof. The forming method of the dielectric material layer 200 includes a deposition process such as chemical vapor deposition (CVD), plasma-enhanced chemical vapor deposition (PECVD), or the like.

In some embodiments, the dielectric material layer 200 is conformal with the dies 40a on the carrier 100, and has a non-planar surface. For example, the dielectric material layer 200 includes a plurality of protrusions on the top surfaces of the dies 40a and gap filling portions between the dies 40a.

Referring to FIG. 5A to FIG. 5B, thereafter, a planarization process is performed on the dielectric material layer 200 to form a dielectric layer 200a laterally aside the dies 40a. The planarization process may include etching process(es), grinding process, CMP process, or combinations thereof. In some embodiments, a portion of the dielectric material layer 200 over the top surfaces of the dies 40a is removed by the planarization process. In some other embodiments, the planarization process may further remove portions of the dies 40a and a portion of the dielectric material layer 200 aside the dies 40a. For example, in some embodiments, the conductive vias 33 of the dies 40a may not be revealed prior to the formation of the dielectric material layer 200, and the planarization process may remove portions of the dies 40a to reveal the conductive vias 33. In some embodiments, after the planarization process is performed, the top surface of the dielectric layer 200a is substantially coplanar with the top surfaces of the dies 40a.

Figure 5C:
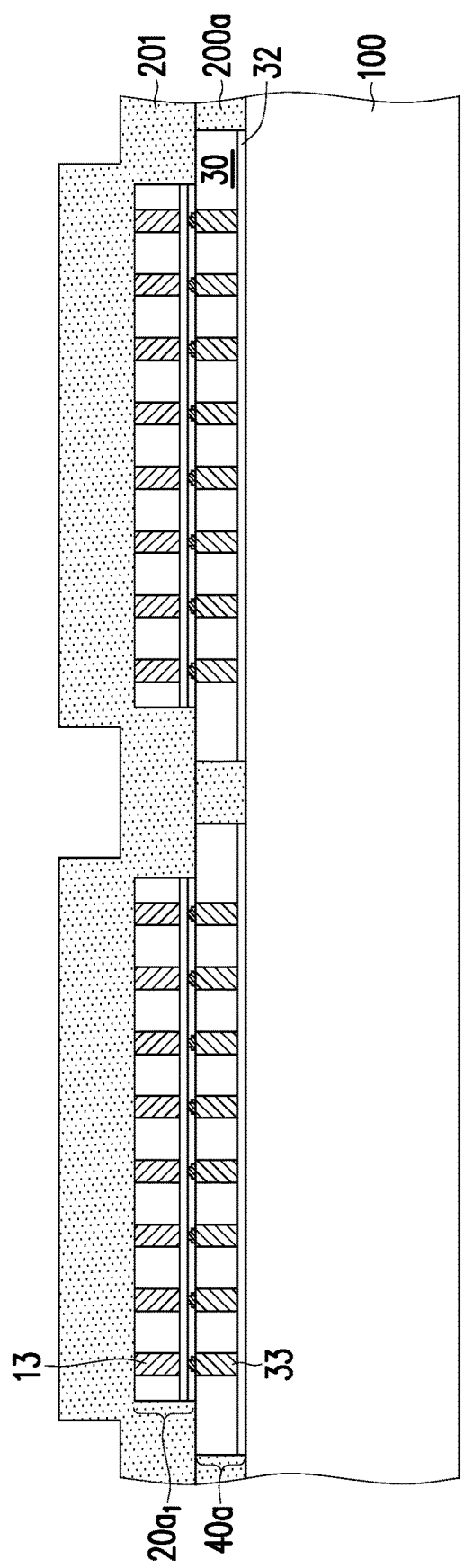

Referring to FIG. 5C, the dies $20a_1$ are electrically bonded to the dies 40a, and a dielectric material layer 201 is formed over the dies 40a and the dielectric layer 200a, so as to cover tops surfaces (e.g., back surfaces) and sidewalls of the dies 20a. In some embodiments, the conductive vias 13 may have been revealed before forming the dielectric material layer 201. The dielectric material layer 201 may include a material the same as or different from that of the dielectric material layer 200. In some embodiments, the dielectric material layer 201 includes inorganic dielectric material, such as oxide (e.g. silicon oxide), nitride (e.g. silicon nitride), oxynitride (e.g. silicon oxynitride), silicon carbonitride (SiCN), silicon carbon oxide (SiCO), or combinations thereof. The forming method of the dielectric material layer 201 includes a deposition process such as chemical vapor deposition (CVD), plasma-enhanced chemical vapor deposition (PECVD), or the like.

In some embodiments, the dielectric material layer 201 is conformal with the dies $20a_1$ and has a non-planar surface. For example, the dielectric material layer 201 includes a plurality of protrusions on the top surfaces of the dies 20a and gap filling portions between the dies $20a_1$.

Figure 5D:
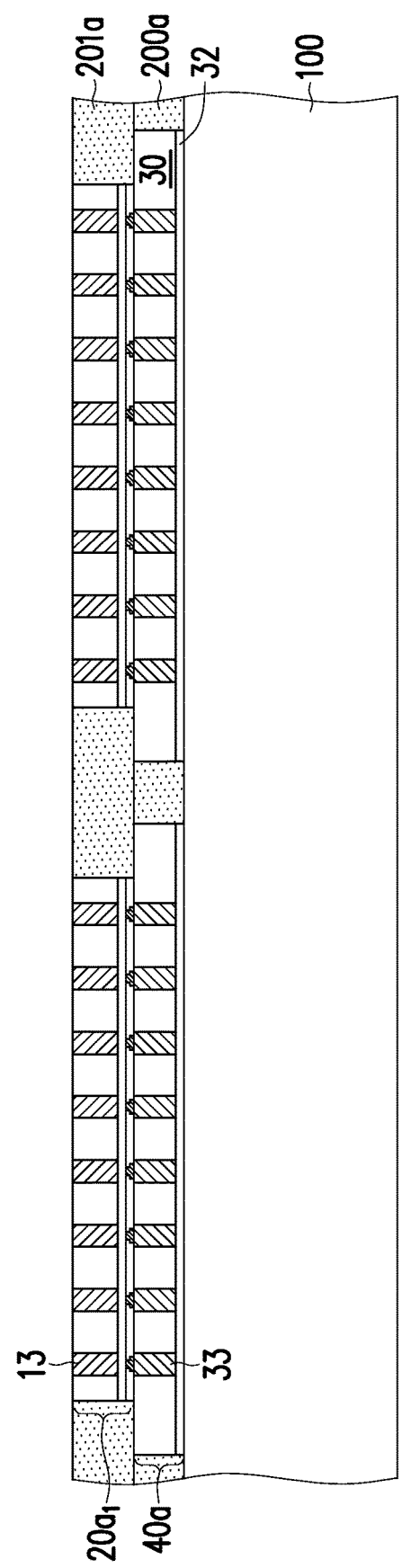

Referring to FIG. 5C to FIG. 5D, thereafter, a planarization process is performed on the dielectric material layer 201 to form a dielectric layer 201a laterally aside the dies $20a_1$. The planarization process may include etching process(es), grinding process, CMP process, or combinations thereof. In some embodiments, a portion of the dielectric material layer 201 over the top surfaces of the dies $20a_1$ is removed by the planarization process. In some other embodiments, the planarization process may further remove portions of the dies $20a_1$ and a portion of the dielectric material layer 201 aside the dies $20a_1$. In some embodiments, the revealing of the conductive vias 13 is implemented during the planarization process. For example, the conductive vias 13 of the dies $20a_1$ may not be revealed prior to the formation of the dielectric material layer 201, and the planarization process may remove portions of the dies $20a_1$ to reveal the TSVs 13. In some embodiments, after the planarization process is performed, the dielectric layer 201a laterally surrounds the dies $20a_1$, and fills the space laterally between the dies $20a_1$, and may also be referred to as a gap fill structure. The top surface of the dielectric layer 201a is substantially coplanar with the top surfaces of the dies $20a_1$.

Figure 5E:
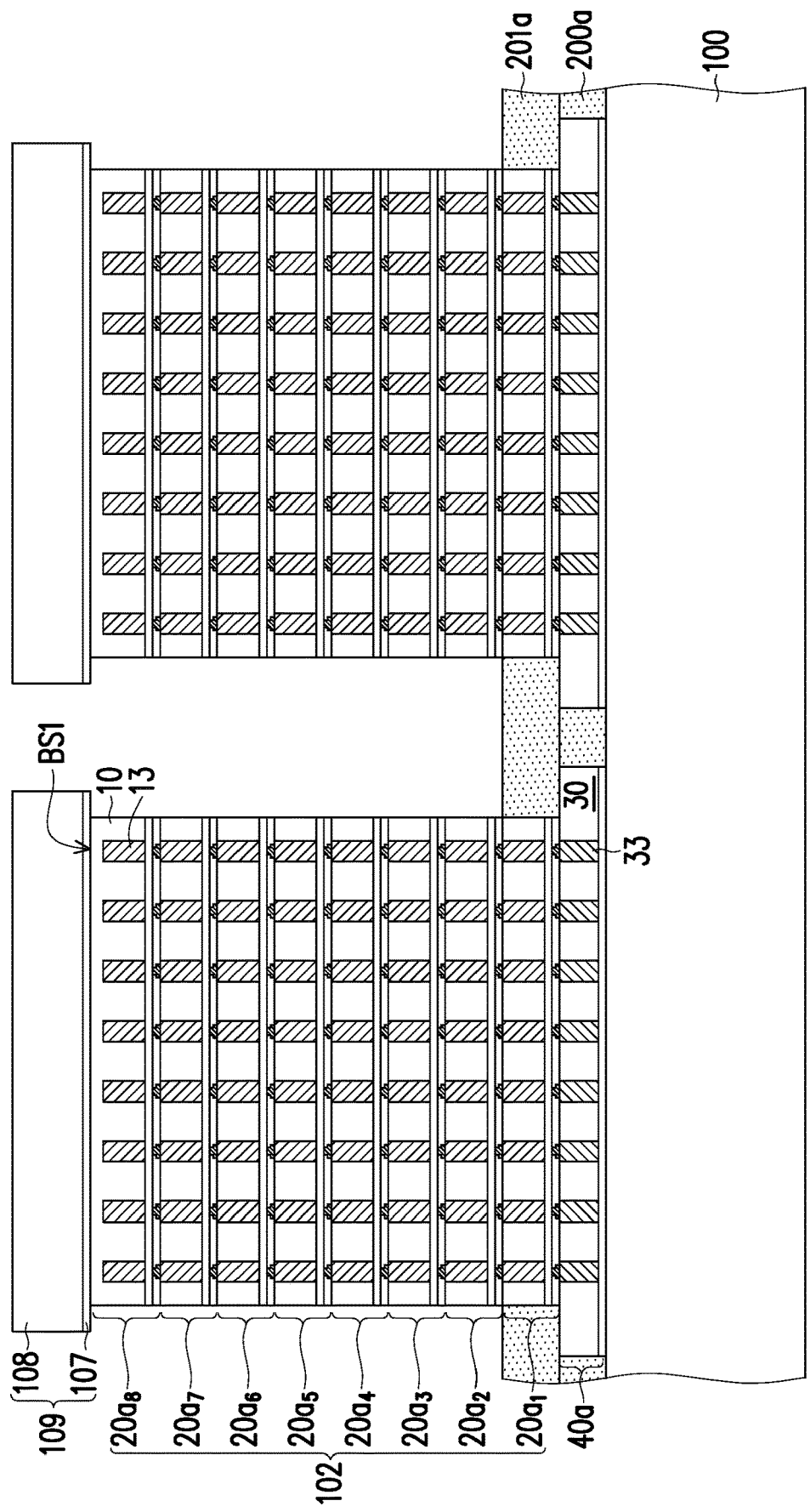

Referring to FIG. 5E, in some embodiments, a plurality of dies, such as the dies $20a_2$-$20a_8$ are subsequently stacked on the die $20a_1$ and over the dielectric layer 201a, and the support structure 109 is bonded to the topmost die $20a_8$. The dies $20a_1$-$20a_8$ constitute a die stack structure 102 electrically bonded to the die 40a. The bonding processes of the dies and the support structure 109 are similar to those described in the first embodiment, which are not described again here.

Figure 5F:
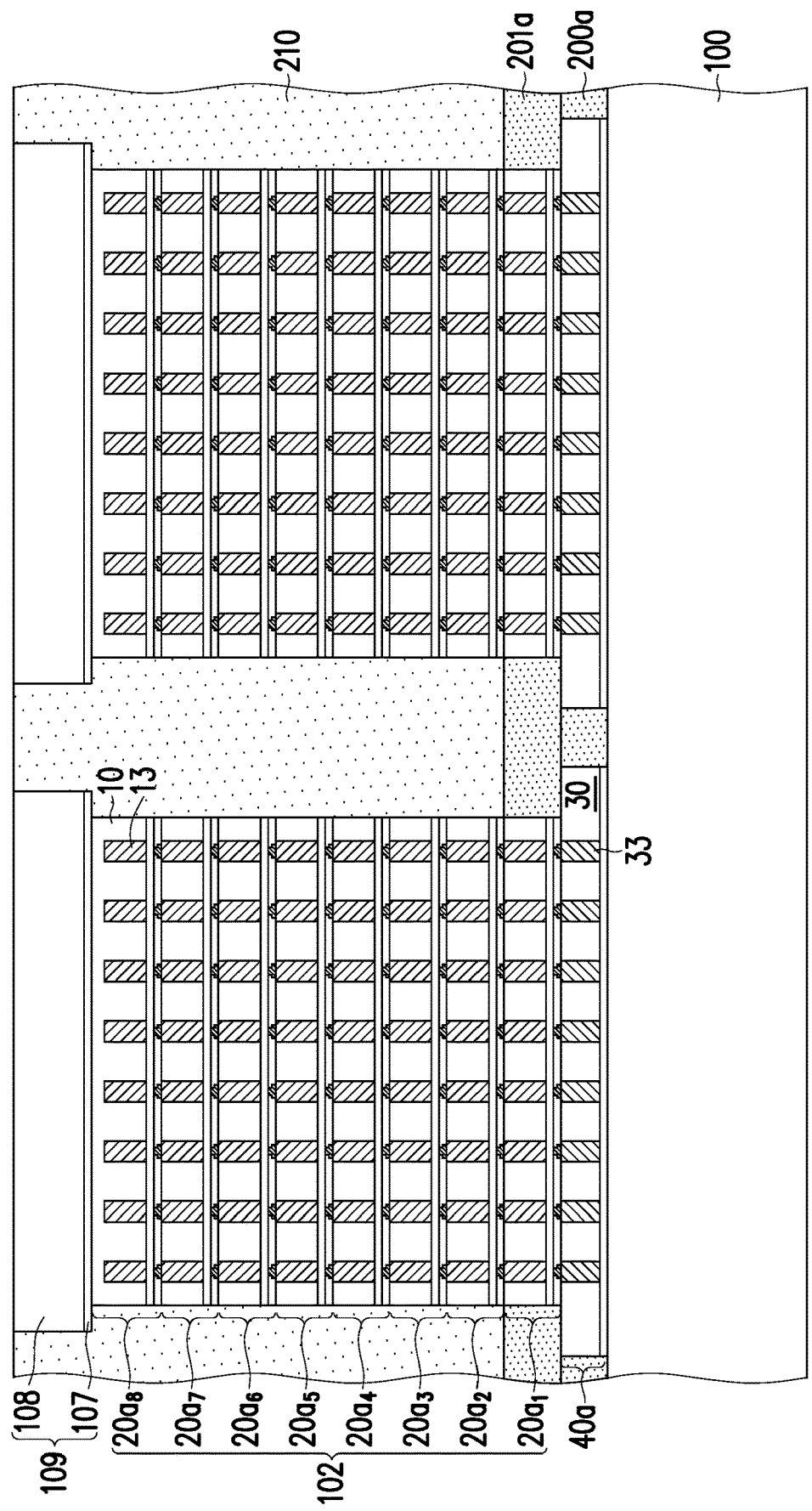

Referring to FIG. 5F, an encapsulant 210 is formed on the dielectric layer 201a to laterally encapsulate sidewalls of the dies $20a_2$-$20a_8$ and the support structure 109. The encapsulant 210 may be formed by an over-molding process and a planarization process. The material the encapsulant 210 is similar to those of the encapsulant 110 as described in the first embodiment, which is not described again here.

Figure 5G:
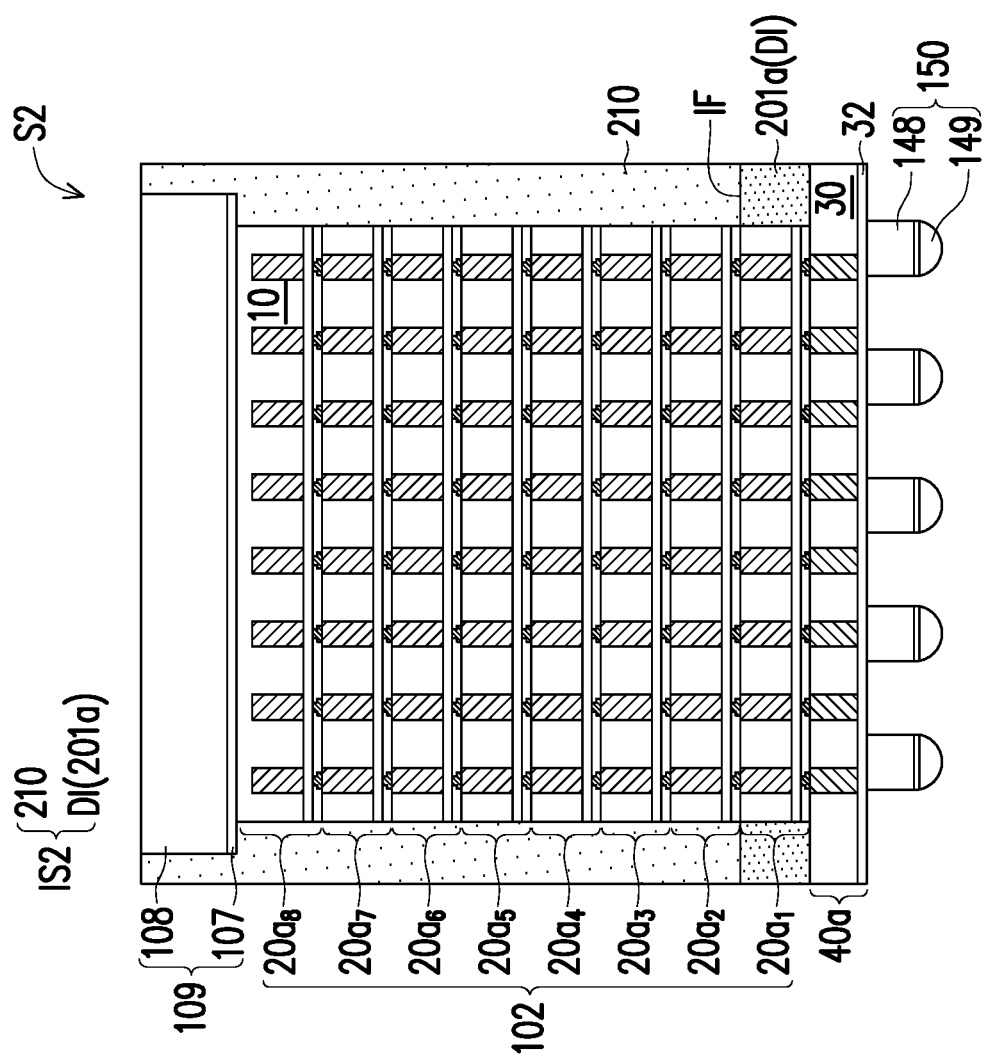

Referring to FIG. 5F and FIG. 5G, thereafter, processes similar to those described in FIG. 4E to FIG. 4F are performed. For example, a temporary carrier may be attached to the encapsulant 210 and the support structure 109, and the temporary carrier 100 is released from the overlying structure. Thereafter, the conductive terminals 150 are formed on the die 40a, so as to electrically connect to the die 40a and the die stack structure 102. The temporary carrier is then released, and a singulation process is performed to form individual semiconductor structures S2. In some embodiments, the dielectric layer 200a may be removed by the singulation process and is not remained in the semiconductor structure S2, but the disclosure is not limited thereto. In alternative embodiments, the dielectric layer 200a may be remained in the semiconductor structure S2, and the sidewalls of the remained dielectric layer 200a may be substantially aligned with the sidewalls of the dielectric layer 201a and encapsulant 210.

Referring to FIG. 5G, the semiconductor structure S2 includes the die 40a, the die stack structure 102, the support structure 109, a dielectric structure DI including the dielectric layer 201a and the encapsulant 210. In some embodiments, the dielectric layer 201a laterally wrapping around the die $20a_1$. The encapsulant 210 laterally encapsulating the dies $20a_2$-$20a_8$ and the support structure 109. The dielectric structure DI and the encapsulant 210 together constitute an insulation structure IS2 laterally wrapping around the die stack structure 102 and the support structure 109. The dielectric structure DI may also be referred to a first insulation structure, and the encapsulant 210 may also be referred to as a second insulation structure.

The dielectric layer 201a and the encapsulant 210 include materials different from each other. For example, the dielectric layer 201a includes inorganic dielectric material, and the encapsulant 210 includes organic materials. In some embodiments, the encapsulant 210 includes fillers (shown in FIG. 4D), while the dielectric layer 201a is free of filler. Some of the filler of the encapsulant 210 may be in contact with the top surface of the dielectric structure DI. An interface IF is existed between the dielectric structure DI and the encapsulant 210. The interface IF is an inorganic/organic interface, for example. In some embodiments, the interface IF is substantially coplanar with the top surface (e.g. back surface) of the die $20a_1$.

In some embodiments, the coefficients of thermal expansion (CTE) of the encapsulant 210 is larger than the CTE of the die stack structure 102 and the support structure 109, the CTE of the dielectric structure DI is less than the CTE of the encapsulant 210 and closer to the CTEs of (e.g. substrates 10 of) the dies of the die stack structure 102 and the support structure 109. Therefore, the dielectric structure DI may help to reduce the CTE of the insulation structure IS2, and therefore reduce the CTE mismatch between the insulation structure IS2 and the die stack structure 102/the support structure 109. In some embodiments, the higher the proportion of the dielectric structure DI in the insulation structure, the more the CTE of the insulation structure may be reduced.

In the semiconductor structure S2 shown in FIG. 5G, the dielectric structure DI is merely formed laterally aside the first layer (i.e. the die $20a_1$) of the die stack structure 102, and the upper layers (i.e. the dies $20a_1$-$20a_7$) of the die stack structure 102 are laterally encapsulated by the encapsulant 210. However, the disclosure is not limited thereto. In the embodiments in which the insulation structure includes a combination of the dielectric structure and the encapsulant, the number of the dies of the die stack structure 102 surrounded by the dielectric structure DI and the number of the dies of the die stack structure 102 encapsulated by the encapsulant 210 are not limited thereto.

Figure 6A:
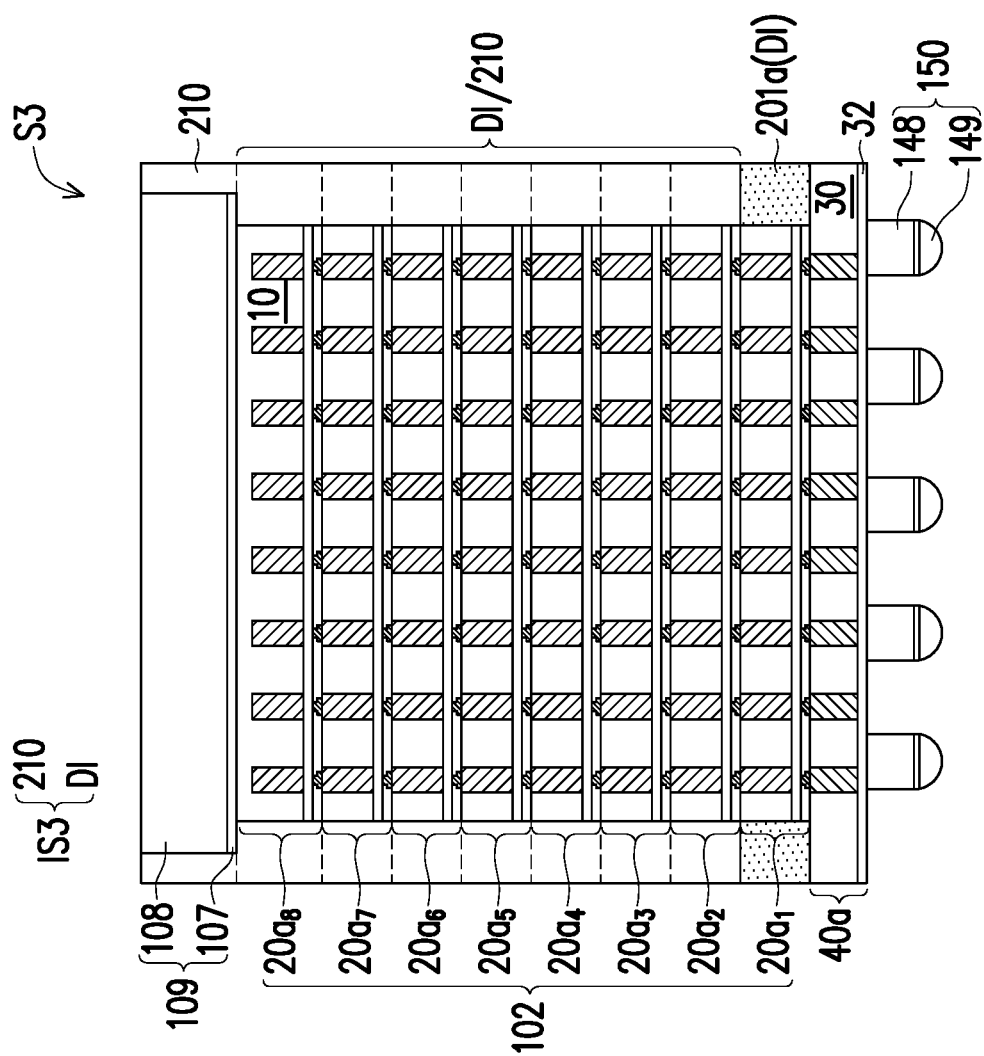
FIG. 6A and FIG. 6B are schematic cross-sectional views illustrating semiconductor structures according to some embodiments of the disclosure.
Figure 6B:
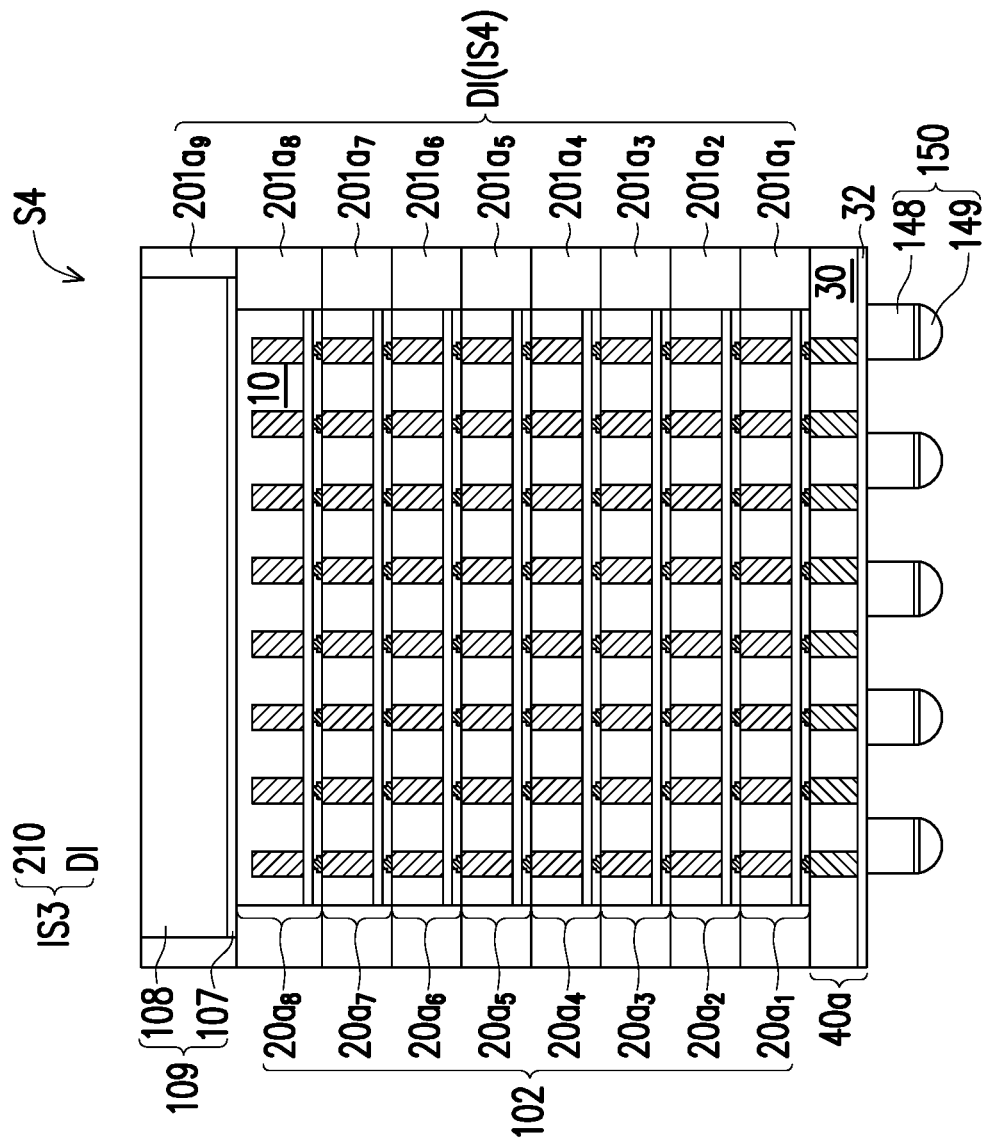

FIG. 6A and FIG. 6B illustrate semiconductor structures S3/S4 according to some other embodiments of the disclosure. The semiconductor structure S3/S4 is similar to the semiconductor structure S2, except that the dielectric structure DI of the semiconductor structure S3/S4 occupies a larger proportion in the insulation structure.

Referring to FIG. 6A, the semiconductor structure S3 includes an insulation structure IS3 laterally wrapping around the die stack structure 102 and the support structure 109. The semiconductor structure S3 includes the dielectric structure DI and the encapsulant 210 on the dielectric structure DI. The insulation dielectric structure DI includes a plurality of dielectric layers, and each of the plurality of dielectric layers laterally wrapping around one or more dies of the die stack structure 102. The plurality of dielectric layers may be formed by a process similar to that of the dielectric layer 201a. For example, the stacked dies with dielectric structure aside thereof may be formed by repeating processes of the die bonding and the formation of the dielectric layer laterally aside the die, as described in FIG. 5A to FIG. 5D.

In other words, more than one layer of the die stack structure 102, for example, the dies $20a_1$ and $20a_2$, the dies $20a_1$-$20a_3$, the dies $20a_1$-$20a_4$, the dies $20a_1$-$20a_5$, the dies $20a_1$-$20a_6$, or the dies $20a_1$-$20a_7$ may be laterally surrounded by the dielectric structure DI, while the other upper layers of the die stack structure 102, for example, the dies $20a_3$-$20a_8$, the dies $20a_4$-$20a_8$, the dies $20a_5$-$20a_8$, the dies $20a_6$-$20a_8$, the dies $20a_7$-$20a_8$, the dies $20a_8$ and the support structure 109 are laterally encapsulated by the encapsulant 210. In some embodiments, all of the dies $20a_1$-$20a_8$ of the die stack structure 102 are laterally surrounded by the dielectric structure DI, and the support structure 109 is laterally encapsulated by the encapsulant 210. In such embodiments, the insulation structure IS3 may include inorganic/inorganic interface(s) between two adjacent dielectric layers of the dielectric structure DI, and an inorganic/organic interface between the topmost dielectric layer of the dielectric structure DI and the encapsulant 210.

Referring to FIG. 6B, in alternative embodiments, the semiconductor structure S4 includes an insulation structure IS4, which merely includes the (inorganic) dielectric structure DI, and is free of encapsulant (inorganic material). In other words, all of the dies $20a_1$-$20a_8$ of the die stack structure 102 and the support structure 109 are laterally surrounded by the dielectric structure DI. In some embodiments, the dielectric structure DI includes a plurality of dielectric layers $201a_1$-$201a_9$ laterally aside the dies $20a_1$-$20a_8$ and the support structure 109, respectively. The dielectric structure DI includes a plurality of inorganic/inorganic interfaces between the adjacent dielectric layers, for example. The top surface of each dielectric layer $201a_1$-$201a_9$ may be substantially coplanar with the top surface of the corresponding die $20a_1$-$20a_8$ or the support structure 109. In such embodiments, after the dielectric layer $201a_8$ is formed laterally aside the topmost die $20a_8$, the support structure 109 is bonded to the die $20a_8$ and the dielectric layer $201a_8$ by a fusion bonding process, and a bonding interface is formed between the bonding film 107 of the support structure 109 and the substrate 10 of the die $20a_8$, and between the bonding film 107 of the support structure 109 and the dielectric layer $201a_8$. For example, the bonding interface between the bonding support structure 109 and the die $20a_8$ may include a dielectric-to-semiconductor bonding, and the bonding interface between the bonding support structure 109 and the dielectric layer $201a_8$ may include dielectric-to-dielectric bonding.

Figure 7:
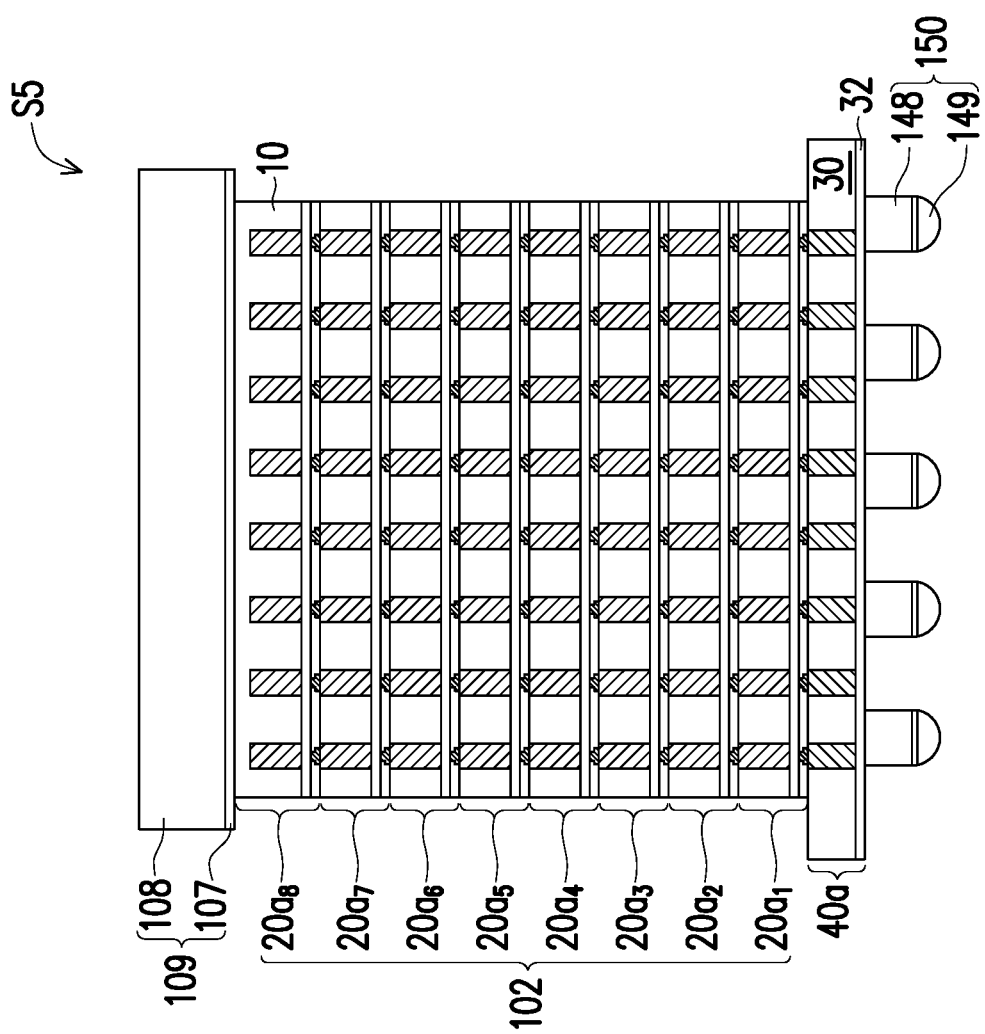
FIG. 7 is a schematic cross-sectional view illustrating a semiconductor structure according to some other embodiments of the disclosure.

FIG. 7 illustrates a semiconductor structure S5 according some other embodiments of the disclosure. The semiconductor structure S5 is similar to the semiconductor structures described above, except that the semiconductor structure S5 is free of insulation structure.

Referring to FIG. 7, in some embodiments, the semiconductor structure S5 includes the die 40a, the die stack structure 102, the support structure 109 and the conductive terminals 150. In some embodiments, the sidewalls of the die 40a, the die stack structure 102 and the support structure 109 are exposed. For example, the processes of forming the insulation structure may be skipped.

FIG. 8A to FIG. 8F are cross-sectional views illustrating a method of forming a semiconductor structure according to a third embodiment of the disclosure. The third embodiment is similar to the first and second embodiments, except that an isolation layer is further formed on the die before the bonding of another die to the die. FIG. 9A to FIG. 9C are enlarged and schematic cross-sectional views of intermediate steps during a process of forming the isolation layer in a dashed area C outlined in FIG. 8A or FIG. 8C according to some exemplary embodiments of the present disclosure.

Figure 8A:
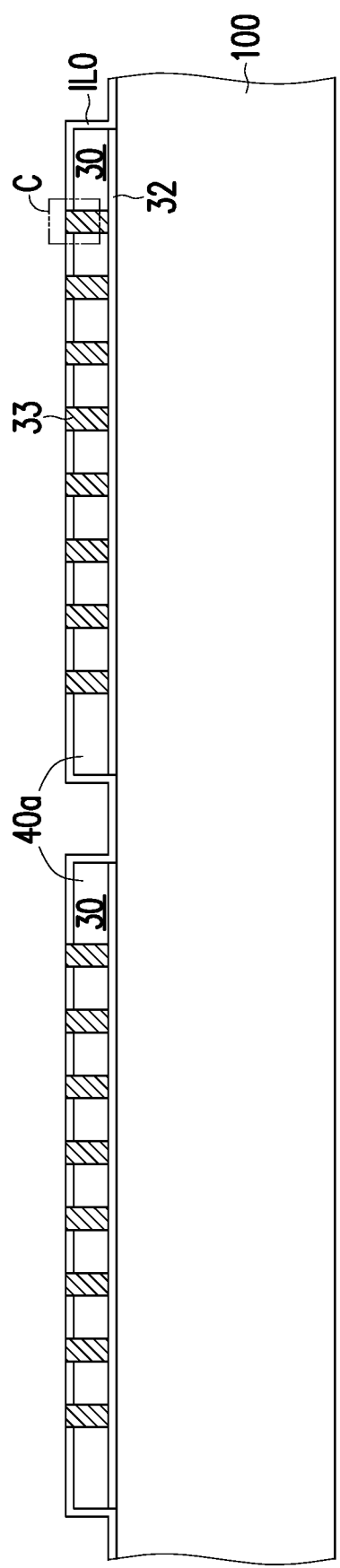
FIG. 8A to FIG. 8F are schematic cross-sectional views illustrating a method of forming a semiconductor structure according to a third embodiment of the disclosure.
Figure 9A:
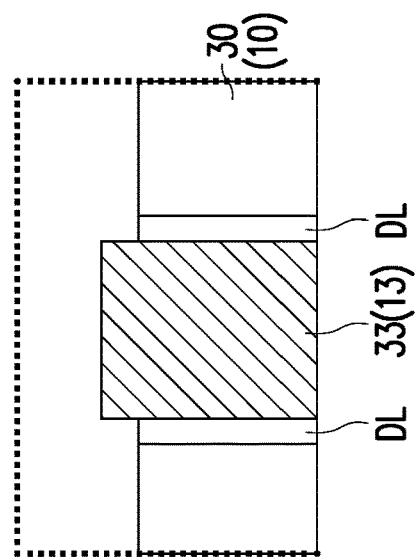
FIG. 9A to FIG. 9C are enlarged schematic cross-sectional views of intermediate steps during a process for forming an isolation layer in a dashed area C outlined in FIG. 8A or FIG. 8C according to some embodiments of the disclosure.
Figure 9B:
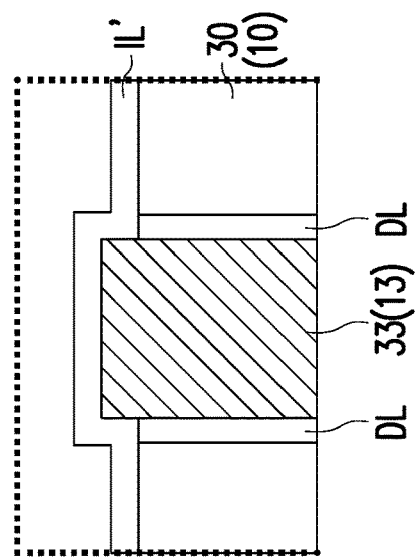
Figure 9C:
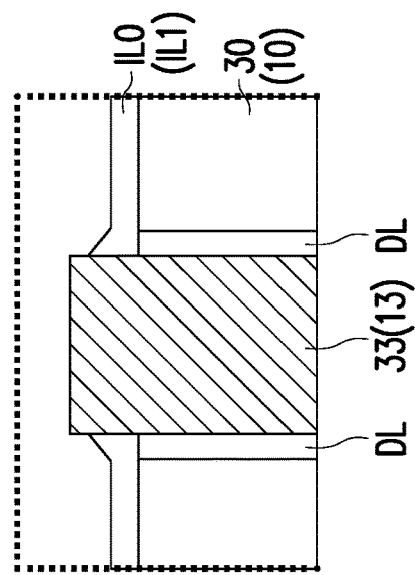

Referring to FIG. 3C and FIG. 8A, in some embodiments, after the die 40a is formed on carrier 100, the substrate 30 of the die 40a is further recessed such that the conductive vias 33 protrudes from the top surface (such as, back surface) of the substrate 30. Thereafter, an isolation layer IL0 is formed on the carrier 100 to cover sidewalls and top surfaces of the substrates 30 of the dies 40a. The topmost surface of the isolation layer IL0 may be substantially coplanar with or lower than the top surfaces of the conductive vias 33. The details are described as below accompanying with the enlarged views FIG. 9A to FIG. 9C.

Referring to FIG. 8A and FIG. 9A, after the conductive vias 33 are revealed from the top surface of the substrate 30, the substrate 30 may further be recessed by an etching process, such that the conductive vias (i.e. TSV) 33 protrudes from the back surface of the substrate 30. The TSV 33 may protrude about a few microns from the back surface of the substrate 30. In some embodiments, the dielectric liner DL is interposed between the substrate 30 and the TSVs 33, and the dielectric liner DL may also be recessed along with the substrate 10 being recessed, and the top surface of the dielectric liner DL may be substantially coplanar with the top surface (e.g. back surface) of the substrate 30, but the disclosure is not limited thereto. In alternative embodiments, the dielectric liner DL may not be recessed.

Referring to FIG. 8A, FIG. 9B and FIG. 9C, an isolation material layer IL' (e.g., silicon nitride, an oxide, silicon oxynitride, silicon carbide, a polymer, the like, etc.) is conformally formed on the carrier 100 and the dies 40a by, for example, spin-coating, a chemical vapor deposition (CVD) process, or the like. Alternatively, a native oxide may be formed on the back surface of the substrate 30. The isolation material layer IL' may be thick enough to cover the protruded portion of the TSV 33. In such embodiments, a portion of the isolation material layer IL' may be removed to accessibly reveal the TSV 33 for further electrical connection by any suitable thinning process (e.g., etching, a planarization process such as grinding, a chemical mechanical polishing (CMP) process, or the like). For example, an etching process with a high etch-rate selectivity between the material of the TSV 33 and the isolation material layer IS may be performed to remove a portion of the isolation material layer IS on top surface of the TSV 33, so as to form the isolation layer IL0. In some embodiments, as shown in FIG. 9C, the bottom portion of the TSV 33 protruding from the back surface of the substrate 30 is laterally covered by the isolation layer IL0, and the top portion of the TSV 33 protruding from the back surface of the substrate 30 is exposed by the isolation layer IL0. However, the disclosure is not limited thereto. In alternative embodiments, the isolation material layer IL' is formed thick enough, and a planarization process is performed to remove the isolation material layer over the TSVs 33, and after the planarization process, the protruding portion of the TSV 33 may be completely laterally covered by the isolation layer IL0, and the top surfaces of the TSV 33 may substantially coplanar with the topmost surface of the isolation layer IL0 (as shown in FIG. 8A).

Figure 8B:
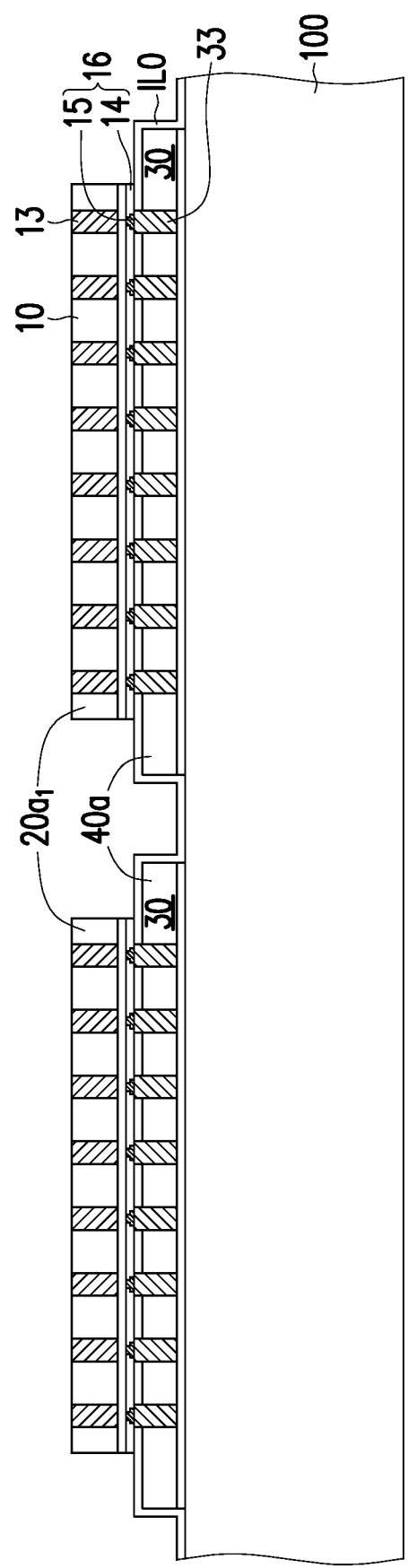

Referring to FIG. 8B, the dies $20a_1$ are then bonded to the dies 40a by the bonding process similar to that described in FIG. 4A to FIG. 4B. For example, the dies $20a_1$ are bonded to the dies 40a in a face-to-back configuration, and the bonding structure 16 of the dies $20a_1$ are bonded to the dies 40a. In the present embodiment, since the isolation layer IL0 is formed on back surface of the substrates 30 of the dies 40a, the bonding structures 16 of the dies $20a_1$ are bonded to the TSVs 33 and the isolation layer IL0 of the dies 40. For example, the dielectric layer 14 of the bonding structure 16 is bonded to the isolation layer IL0 through dielectric-to-dielectric bonding (e.g., oxide-to-nitride bonding), and the bonding conductors 15 of the bonding structure 16 are bonded to the TSVs 33 through metal-to-metal bonding. In such embodiments, the dimension (e.g. bottom width) of the bonding conductor 15 may be less than, equal to or larger than the dimension (e.g. top width) of the corresponding TSV 33. If the dimension of the bonding conductor 15 is larger than the dimension of the corresponding TSV 33, the isolation layer IL0 may help to prevent the metal of the bonding conductor 15 from diffusing into the substrate 10 of the die 40a.

Figure 8C:
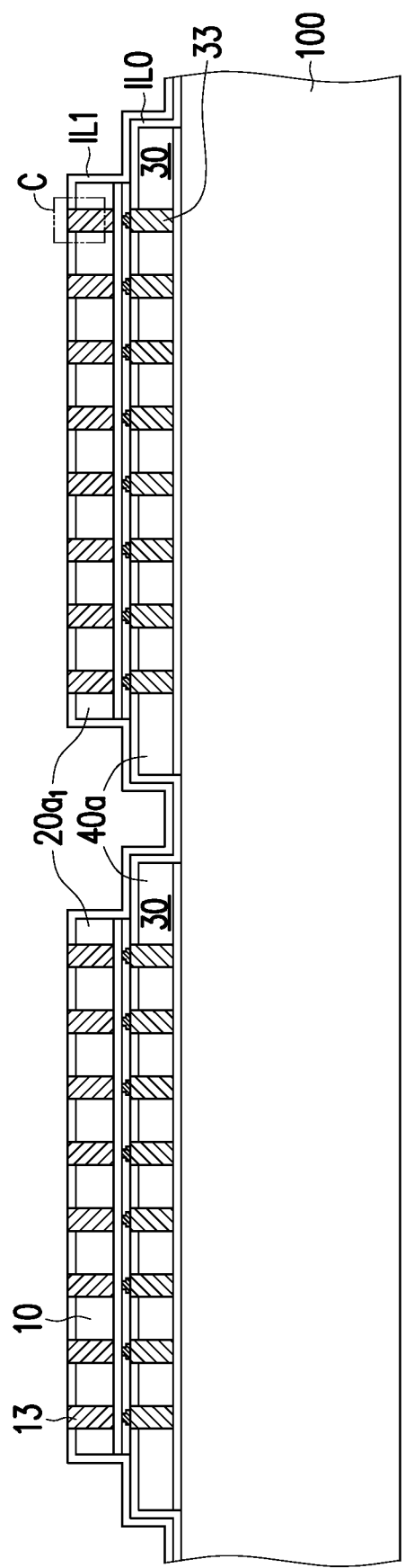

Referring to FIG. 8B and FIG. 8C, after the conductive vias 13 of the dies $20a_1$ are revealed by the substrate 10, the substrate 10 of the die $20a_1$ may further be recessed, such that the conductive vias 13 protrudes form the top surface (e.g. back surface) of the substrate 10, and an isolation layer IL1 is further formed over the carrier 10 to cover the sidewalls of the dies $20a_1$, the top surfaces of the substrates 10 and the portion of the isolation layer IL0 uncovered by the dies $20a_1$. The portion of the conductive vias 13 protruding from the top surface of the substrate 10 may be partially or completely laterally covered by the isolation layer IL1, and the top surface of the conductive via 13 may be lower than or substantially coplanar with the topmost surface of the isolation layer IL1. The material and forming method of the isolation layer IL1 are similar to those of the isolation layer IL0, which are not described again here.

Figure 8D:
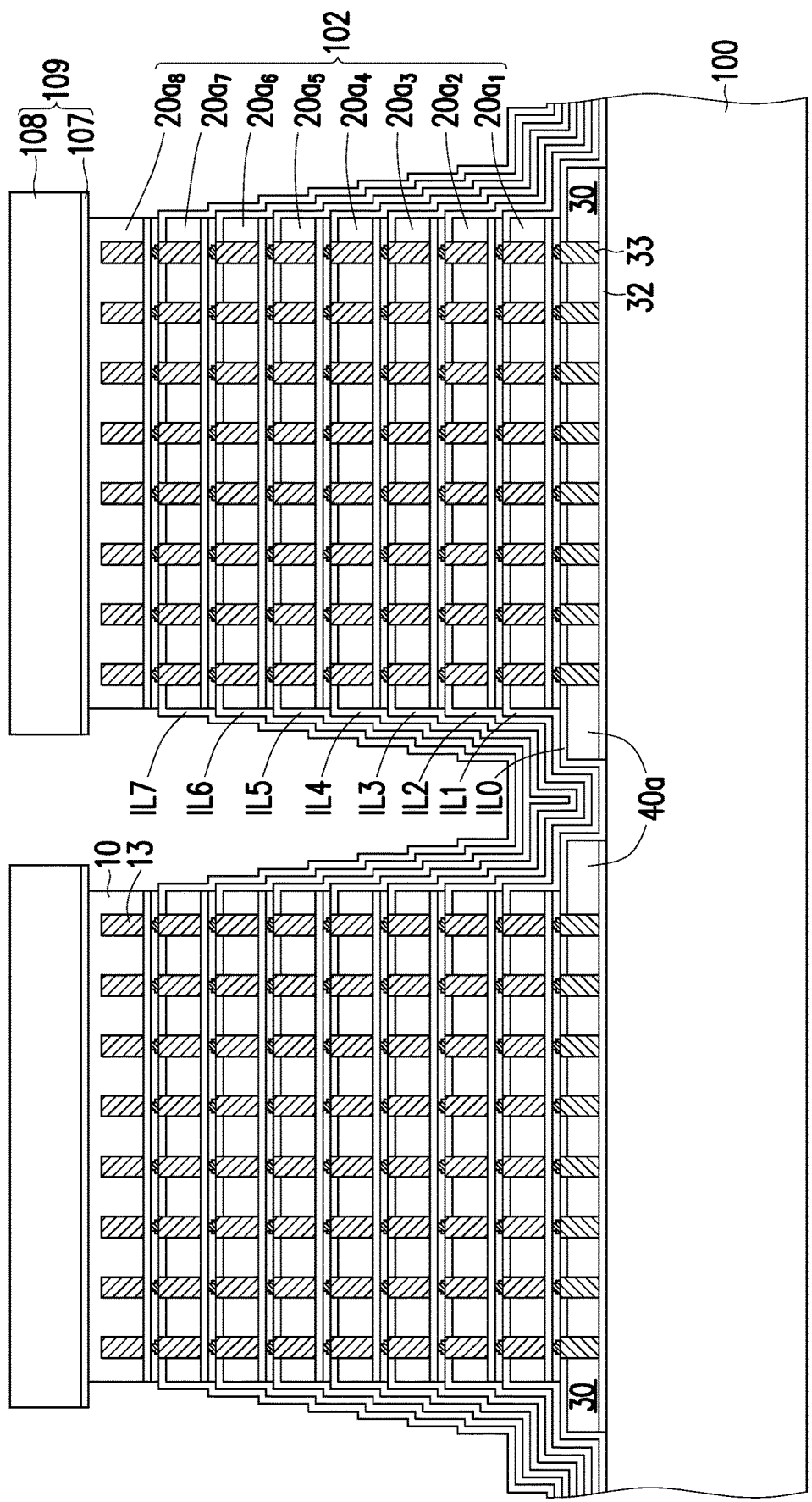

Referring to FIG. 8D, thereafter, processes similar to those described in FIG. 8B to FIG. 8C are repeated, so as to bonding a plurality of dies (such as, the dies $20a_2$-$20a_8$) on the die $20a_1$, and isolation layers (IL2-IL8) are formed on the back surfaces of the corresponding dies before the bonding process. For example, the dies $20a_3$ are bonded to the dies $20a_2$, the dies $20a_4$ are bonded to the dies $20a_3$, the dies $20a_5$ are bonded to the dies $20a_4$, the dies $20a_6$ are bonded to the dies $20a_5$, the dies $20a_7$ are bonded to the dies $20a_6$, and the dies $20a_8$ are bonded to the dies $20a_7$. The isolation layers IL2-IL7 are formed on the corresponding die before the die bonding process is performed, respectively. In some embodiments in which the die $20a_8$ is the topmost die of the die stack structure 102, the formation of an isolation layer on the die $20a_8$ may be omitted, and the sidewalls and top surfaces of the die $20a_8$ may be not covered by an isolation layer.

Still referring to FIG. 8D, the thicknesses and the materials of the isolation layers IL0-IL7 may be the same as or different from each other. In some embodiments, the number of layers and thickness of the isolation layers covering sidewalls of the die at a lower height level are larger than those of the isolation layers covering sidewalls of the die at a higher height level. For example, the number of the layers and thickness of the isolation layers covering sidewalls of the respective die is gradually reduced from bottom to top. For example, in the present embodiment, the thickness of the eight layers of the isolation layers (IL0-IL7) covering sidewalls of the die 40a is larger than the thickness of the seven layers of the isolation layers (IL1-IL7) covering the sidewalls of the bottommost die $20a_1$ of the die stack structure 102. In some embodiments, among the die stack structure 102, the bottommost die $20a_1$ has the thickest isolation layers (IL1-IL7) covering the sidewalls of the substrate 10 thereof, and the die $20a_7$ immediately under the topmost die $20a_8$ has the thinnest isolation layer (IL7) covering the sidewalls of the substrate 10 thereof.

Still referring to FIG. 8D, in some embodiments, the conductive vias 13 of the topmost die $20a_8$ may be not revealed from the back surface of the die $20a_8$, or the topmost die $20a_8$ may not include conductive vias in the substrate. After the topmost die $20a_8$ of the die stack structure 102 is bonded to the underlying die $20a_7$, the support structure 109 is bonded to the die $20a_8$ through the bonding film 107.

Figure 8E:
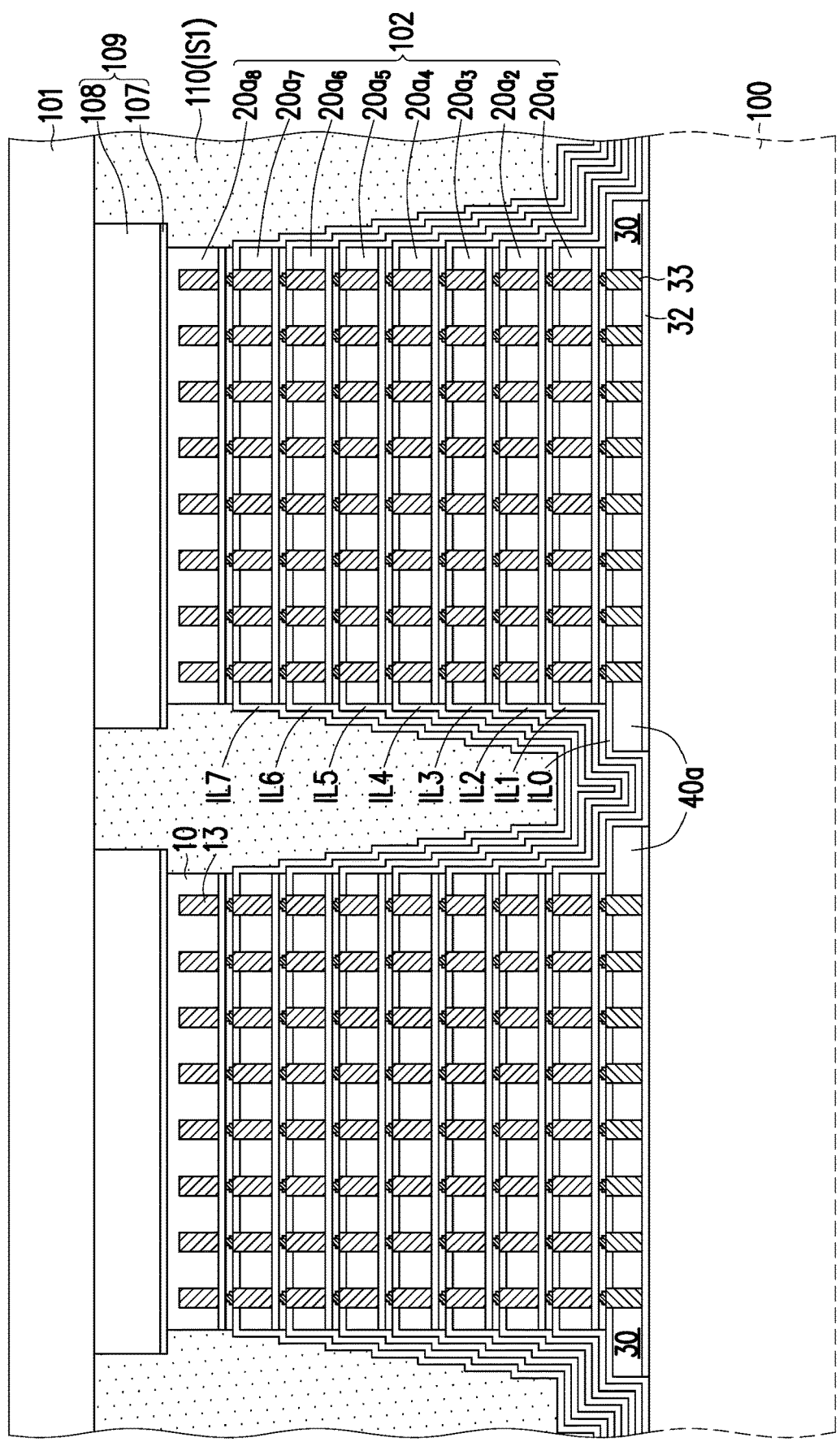

Referring to FIG. 8E, thereafter, processes similar to those described in FIG. 4E to FIG. 4G may be performed. For example, the insulation structure IS1, such as an encapsulant 110 may be formed on the carrier 100 to laterally encapsulate the die 40a, the die stack structure 102 and the support structure 109. The insulation structure IS1 may be formed by an over-molding process and a planarization process. The top surface of the insulation structure IS1 may be substantially coplanar with the top surface of the support structure 109. Thereafter, the carrier 101 may be optionally attached to the support structure 109 and the insulation structure 110. The carrier 100 is released from the overlying structure.

Figure 8F:
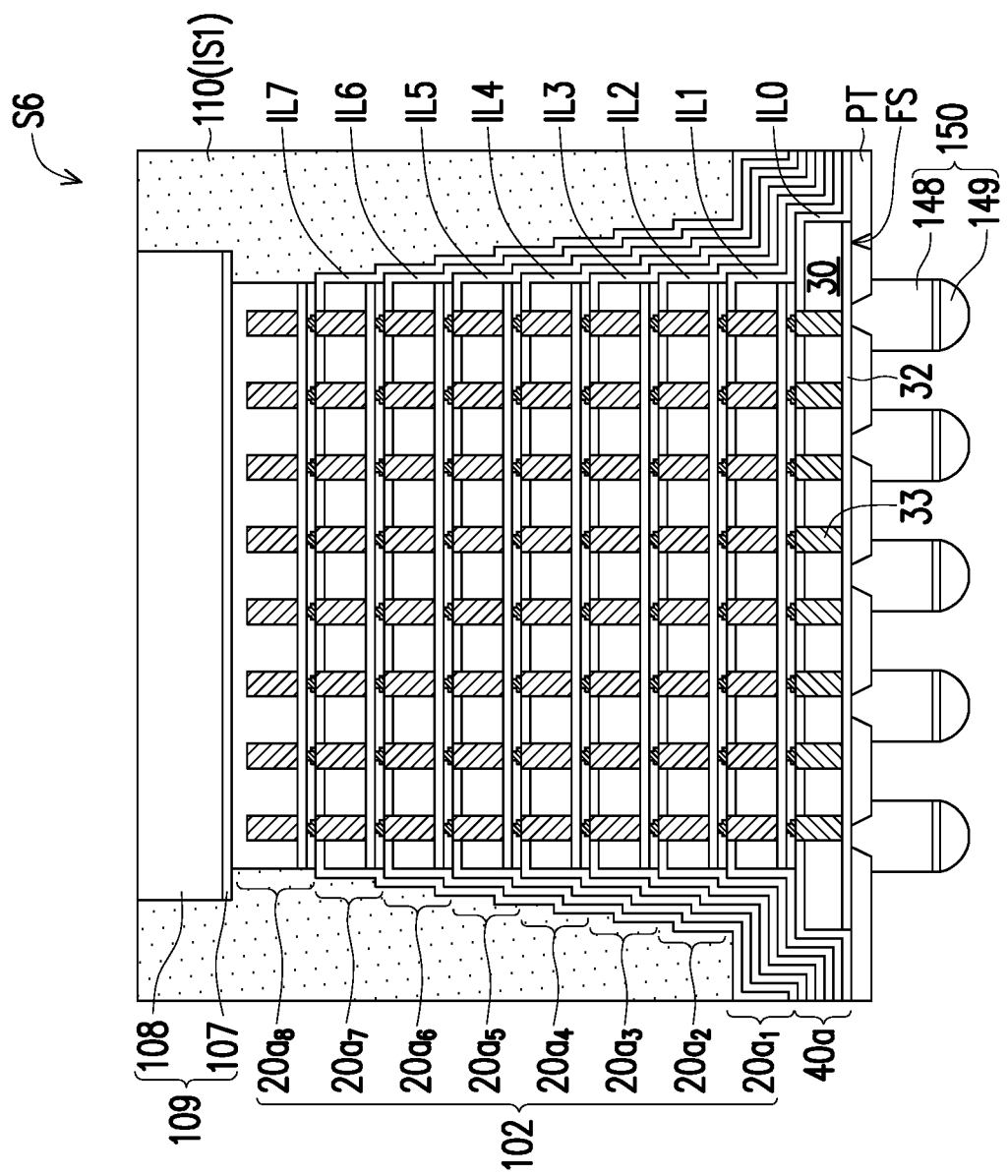

Referring to FIG. 8E and FIG. 8F, after removing the temporary carrier 100, the conductive terminals 150 may be formed on the front surface of the die 40a. In some embodiments, before forming the conductive terminals 150, a protection layer PT is formed on the front surface FS of the die 40a. In some embodiments, the protection layer PT may extend to cover the isolation layer IL0. For example, the protection layer PT includes passivation materials such as silicon oxide, silicon nitride, un-doped silicate glass, polyimide, or other suitable insulating materials for protecting the underlying structures. Alternatively, the protection layer PT is omitted. In some embodiments, the protection layer PT includes a plurality of openings exposing at least a portion of the underlying conductive features of the die 40a for further electrical connection. For example, the conductive terminals 150 are formed in the openings of the protection layer PT to be in physical and electrical contact with the conductive features of the interconnect structure 32 of the die 40a. The forming process of the conductive terminals 150 may be similar to the process described in conjunction with FIG. 4F, and the detailed descriptions are omitted for brevity.

Referring to FIG. 8F, a semiconductor structure S6 is thus completed. The semiconductor structure S6 includes the die 40a, the die stack structure 102, the isolation layers IL0-IL7, the support structure 109, the insulation structure IS1 and the conductive terminals 150. In some embodiments, the portions of the isolations layers IL0-IL7 aside the dies are stacked on one another, and the topmost isolation layer IL7 is covered by and in contact with the encapsulant 110. The other isolation layers IL0-IL6 are separated from the encapsulant 110. In some embodiments, the sidewalls of the insulation structure IS1 may be substantially aligned with the sidewalls of the isolation layers IL0-IL7. The sidewalls of the die 40a may be covered by the isolation layers or exposed.

Figure 10A:
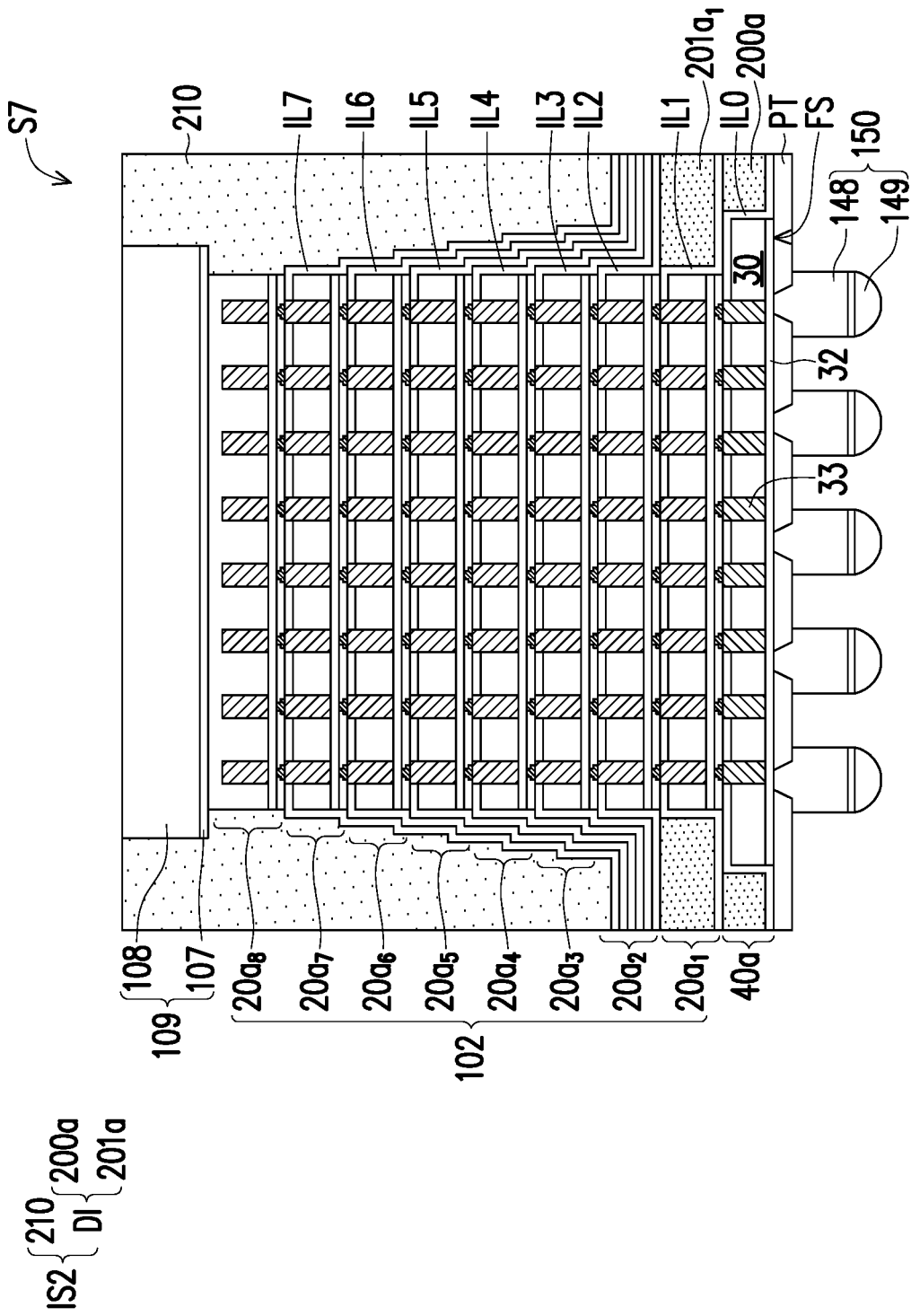
FIG. 10A and FIG. 10B are schematic cross-sectional views illustrating semiconductor structures according to some embodiments of the disclosure.
Figure 10B:
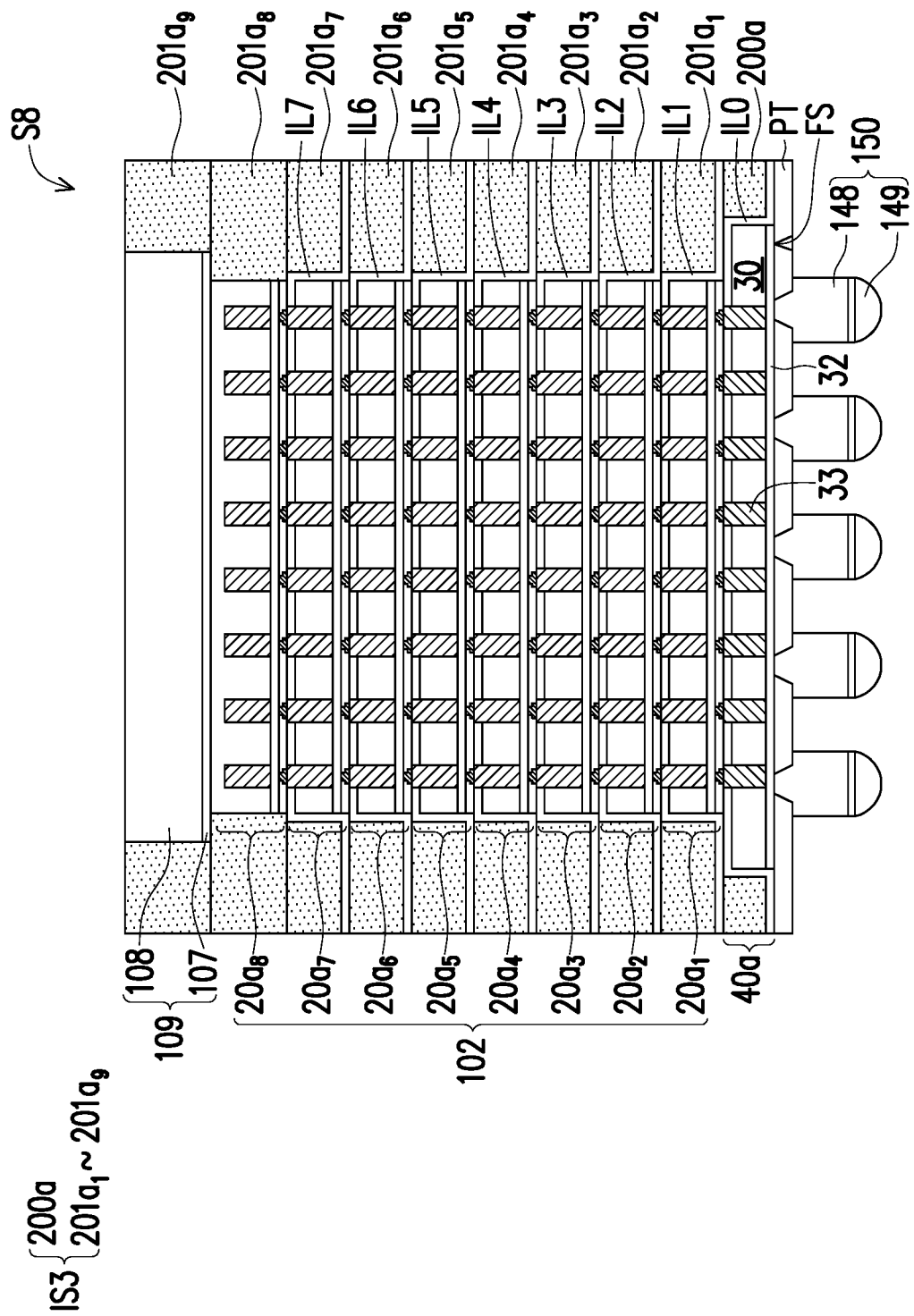

FIG. 10A and FIG. 10B are cross-sectional views of semiconductor structures S7/S8 according to some other embodiments of the disclosure. The semiconductor structures S7/S8 shown in FIG. 10A and FIG. 10B are similar to the semiconductor structure S6, except that the insulation structure including inorganic dielectric structure is used.

Referring to FIG. 10A, in some embodiments, the semiconductor structure S6 includes a dielectric structure DI and an encapsulant 210 over the dielectric structure DI. The dielectric structure DI may include a plurality of dielectric layers, the isolation layers and the dielectric layers may be alternatively stacked on one another. For example, the dielectric structure DI includes the dielectric layer 200a aside the die 40a and the dielectric layer $201a_1$ aside the die $20a_1$. In some embodiments, the dielectric layer 200a and the dielectric layer $201a_1$ are separated from each other by the isolation layer IL1 therebetween, the dielectric layer $201a_1$ and the encapsulant 210 are separated from each other by the isolation layer IL2 therebetween.

In some embodiments, the dielectric structure DI and the encapsulant 210 may be formed as follows: after the isolation layer IL0 is formed extending on and aside the die 40a, the dielectric layer 200a is formed laterally aside the die 40a with a top surface substantially coplanar with the topmost surfaces of the isolation layer IL0 and the TSVs 33 of the die 40a. Thereafter, the die $20a_1$ is bonded to the die 40a, and the isolation layer IL1 is formed extending along the surfaces of the die $20a_1$, the top surface of the isolation layer IL0 and the top surface of the dielectric layer 200a. The dielectric layer $201a_1$ is then formed laterally aside the die $20a_1$. Afterwards, the dies $20a_2$-$20a_8$ are bonded on the die 20a1, and the isolation layers IL2-IL7 are respectively formed on the back surfaces of the dies $20a_2$-$20a_7$ before the corresponding bonding process. After the support structure 109 is bonded to the die stack structure 102, the encapsulant 210 is formed to laterally encapsulate the dies $20a_2$-$20a_7$ and the support structure 109.

Referring to FIG. 10B, in some embodiments, the semiconductor structure S8 includes an insulation structure IS3 which is free of encapsulant. In some embodiments, after the isolation layer IL0 is formed on the die 40a, and the dielectric layer 200a is formed laterally aside the die 40a, the processes including die bonding, forming isolation layer on the die and forming dielectric layer on the isolation layer and laterally aside the die are repeated, so as to stack dies $20a_1$-$20a_7$ and form the isolation layers IL1-IL7 and the dielectric layers $201a_1$-$201a_7$ over the die 40a. In some embodiments in which the die $20a_8$ is the topmost die of the die stack structure 102, after the die $20a_8$ is bonded to the die $20a_7$, the dielectric layer $201a_8$ is formed on the dielectric layer $201a_7$ and aside the die $20a_8$, without forming an isolation layer. Thereafter, the protection layer 109 is bonded to the die $20a_8$ and the dielectric layer $201a_8$, and the dielectric layer $201a_9$ is then formed laterally aside the support structure 109.

The insulation structure IS3 includes a plurality of dielectric layers 200a and $201a_1$-$201a_9$. The dielectric layer 200a is laterally aside the die 40a, and the dielectric layers $201a_1$-$201a_8$ are laterally aside the dies $20a_1$-$20a_8$, respectively, and the dielectric layer $201a_9$ is laterally aside the support structure 109. In some embodiments, the isolation layers IL0-IL7 are respectively formed extending along the corresponding die and dielectric layer. Portions of the isolation layers IL0-IL7 are alternatively stacked with the dielectric layers 200a, and $201a_1$-$201a_7$. The adjacent two dielectric layers of the dielectric layers $201a_1$-$201a_7$ are separated by the corresponding isolation layer therebetween. In some embodiments, the die $20a_8$ is the topmost die of the die stack structure 102 and is free of isolation layer, and the dielectric layers $201a_7$-$201a_8$ are in contact with each other.

FIG. 11A to FIG. 11F are cross-sectional views illustrating a method of forming a semiconductor structure according to a fourth embodiment of the disclosure. The fourth embodiment is similar to the foregoing embodiments, except that the die stack structure is formed prior to bonding to the die 40a.

Figure 11A:
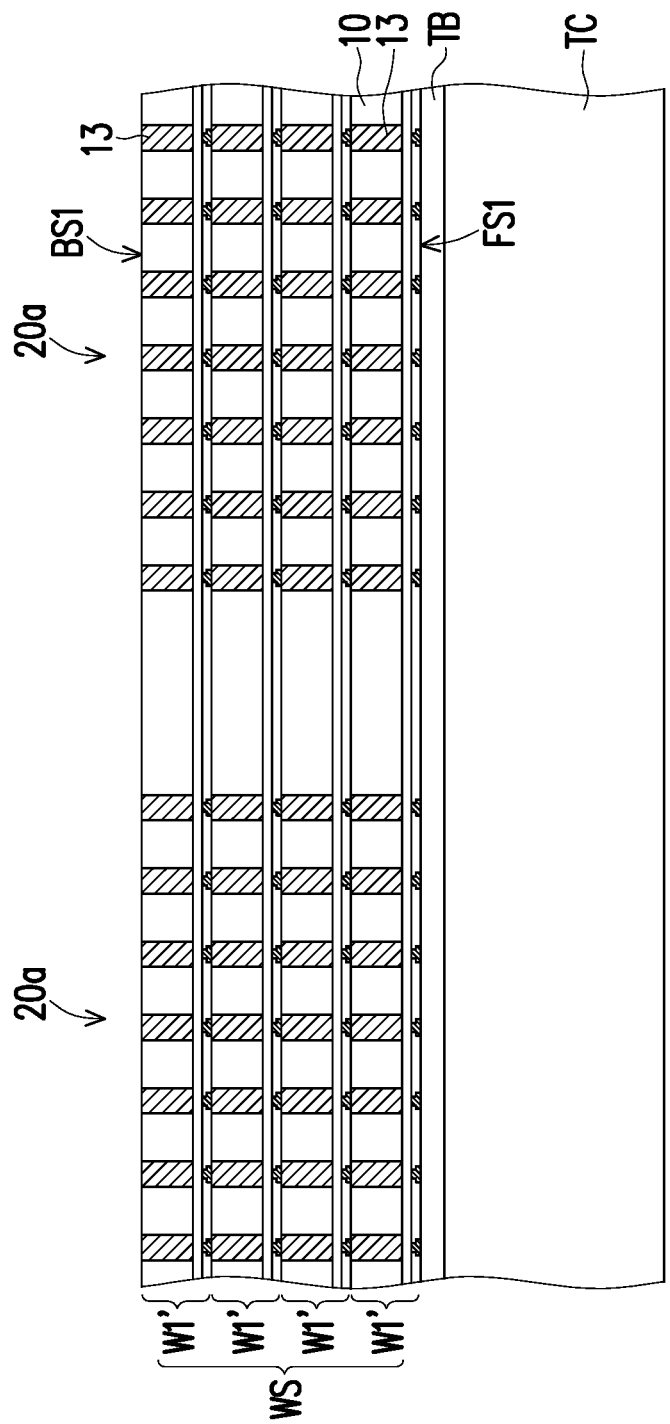
FIG. 11A to FIG. 11F are schematic cross-sectional views illustrating a method of forming a semiconductor structure according to a fourth embodiment of the disclosure.

Referring to FIG. 2C and FIG. 11A, in some embodiments, after the wafer W1' including a plurality of dies 20a are formed on the temporary carrier TC. Another wafer W1 (as shown in FIG. 2A) may be bonded to the wafer W1' in a face-to-back configuration, for example. Thereafter, the another wafer W1 may be thinned to form another thinned wafer W1' over the temporary carrier TC.

The bonding and thinning processes may be similar to the processes described above. It should be appreciated that various methods have been employed for wafer-to-wafer bonding. For example, the wafer-to-wafer bonding includes eutectic bonding, fusion bonding, direct metal bonding, hybrid bonding, any combinations thereof, and/or the like. In some embodiments in which the eutectic bonding occurs, two eutectic materials are placed together, and then a high pressure and a high temperature are applied so that the eutectic materials are melted, and when the melted eutectic materials solidify, the semiconductor wafers are bonded together. In some embodiments in which the fusion bonding occurs, an oxide surface of the another wafer is bonded to an oxide surface or a semiconductor surface (e.g. silicon surface) of the wafer. In some embodiments in which the direct metal-to-metal bonding occurs, two bonding conductors are pressed against each other at an elevated temperature, and the inter-diffusion of the bonding conductors may cause the bonding of the bonding conductors. In some embodiments in which the hybrid bonding occurs, the bonding conductors of two semiconductor wafers are bonded together through direct metal-to-metal bonding, and an oxide surface of one of the two semiconductor wafers is bonded to an oxide surface or a silicon surface of the other semiconductor wafer.

In some embodiments, the bonding and the thinning processes are repeated several times to form the wafer stack WS having multiple tiers. It should be appreciated that the wafer stack WS may include any number of tiers. The wafer at the topmost tier of the wafer stack WS may be or may not be thinned to reveal the conductive vias 13 depending on the product requirements.

Figure 11B:
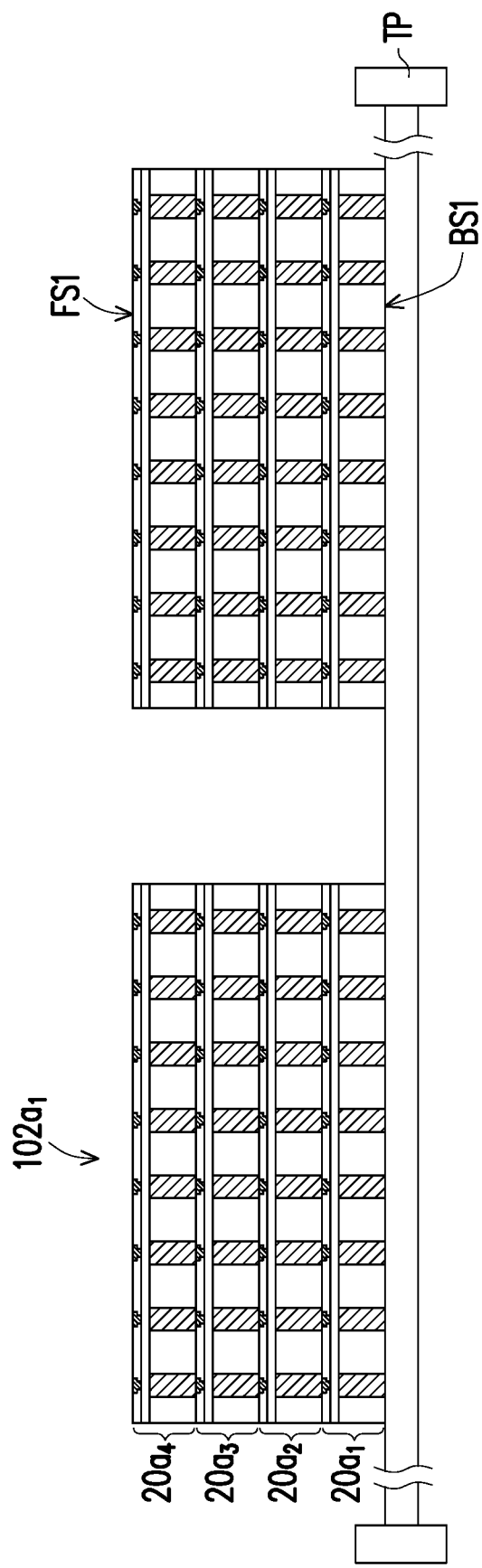

Referring to FIG. 11A and FIG. 11B, the wafer stack WS may be mounted on the tape frame TP for performing the singulation process. For example, the structure shown in FIG. 11A is overturned (e.g., flipped upside down) and attached to the tape frame TP. Next, the temporary carrier TC is de-bonded from the wafer stack WS. In some embodiments in which the temporary bonding layer TB is disposed between the wafer stack WS and the temporary carrier TC, the cleaning process is optionally performed to remove undesired residues of the temporary bonding layer TB left at the surface of the thinned wafer W1'. Subsequently, the singulation process is performed on the wafer stack WS to form a plurality of die stack structures $102a_1$. In some embodiments, the die stack structure $102a_1$ includes the dies $20a_1$-$20a_4$. It should be noted that above examples are provided for illustrative purposes, the formation of the die stack structure $102a_1$ can be formed in any logical order which are not limited in the disclosure. In some embodiments, the individual die stack structure $102a_1$ includes several semiconductor dies having the same or similar function(s) and stacked upon one another. In an embodiment, the die stack structure $102a_1$ is a memory cube that is suitable for rapid data access applications. The number of the dies included in the die stack structure $102a_1$ is merely for illustration, and the disclosure is not limited thereto.

Figure 11C:
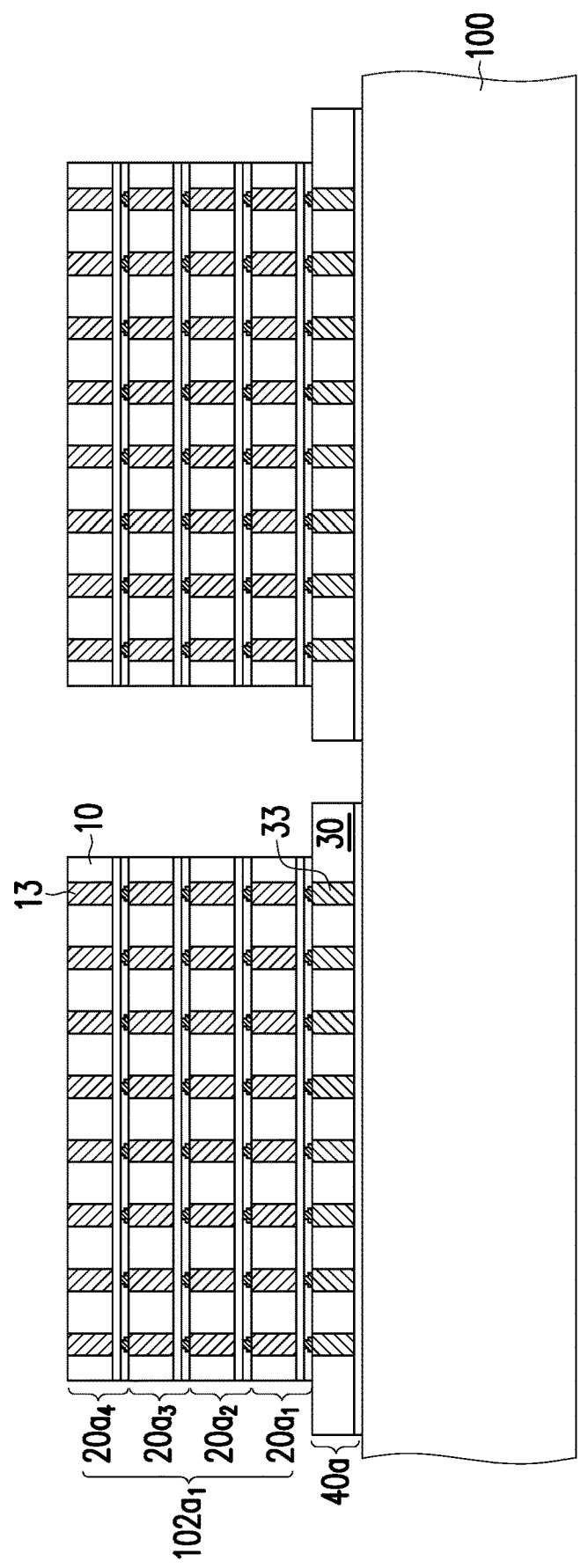

Referring to FIG. 3C, FIG. 11B and FIG. 11C, in some embodiments, the die stack structure $102a_1$ including the dies $20a_1$-$20a_4$ is bonded to the die 40a over the carrier 100. Thereafter, referring to FIG. 11D, another die stack structure $102a_2$ is bonded to the die stack structure $102a_1$, the structure and forming method of the die stack structure $102a_2$ may be similar to those of the die stack structure $102a_1$, and the number of the dies included in the die stack structure $102a_2$ may be the same as or different from the number of the dies included in the die stack structure $102a_1$. In an embodiment, the die stack structure $102a_2$ includes the dies $20a_5$-$20a_8$, and the conductive vias 13 of the die $20a_8$ may be not revealed. As such, the die stack structure $102a_1$ and the die stack structure $102a_2$ together constitute the die stack structure 102. In some embodiments, the die stack structures $102a_1$ and $102a_2$ may also be referred to as sub-stack structure. It is noted that, the number of the sub-stack structures included in the die stack structure 102 and the number of the dies included in each sub-stack structure shown in the figures are merely for illustration, and the disclosure is not limited thereto. In alternative embodiments, the die stack structure 102 may include a single die stack structure formed prior to bonding to the die 40a.

Figure 11D:
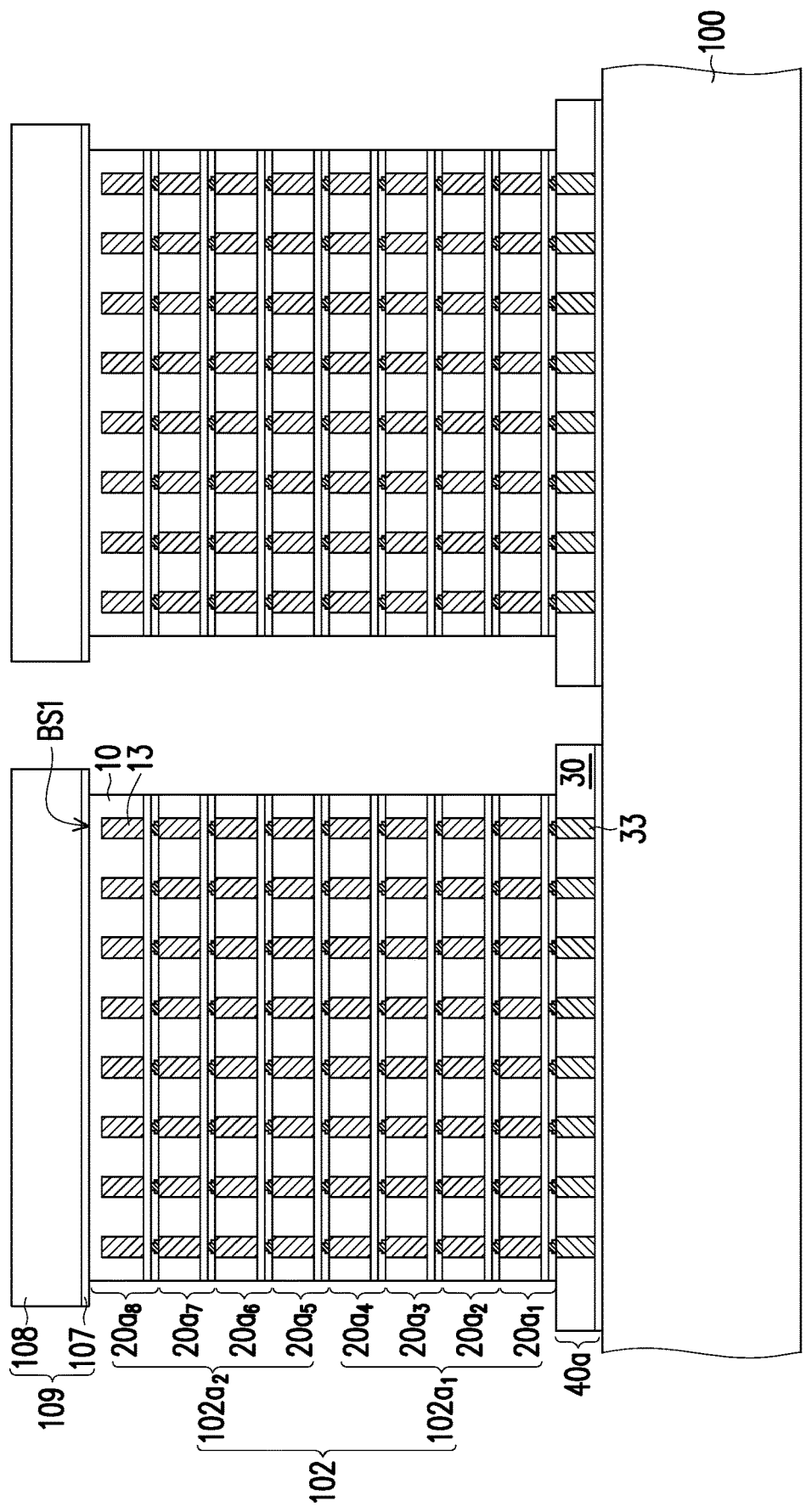

Referring to FIG. 11D, after the die stack structure 102 is formed, the support structure 109 is bonded to the die stack structure 102 through the bonding film 107.

Figure 11E:
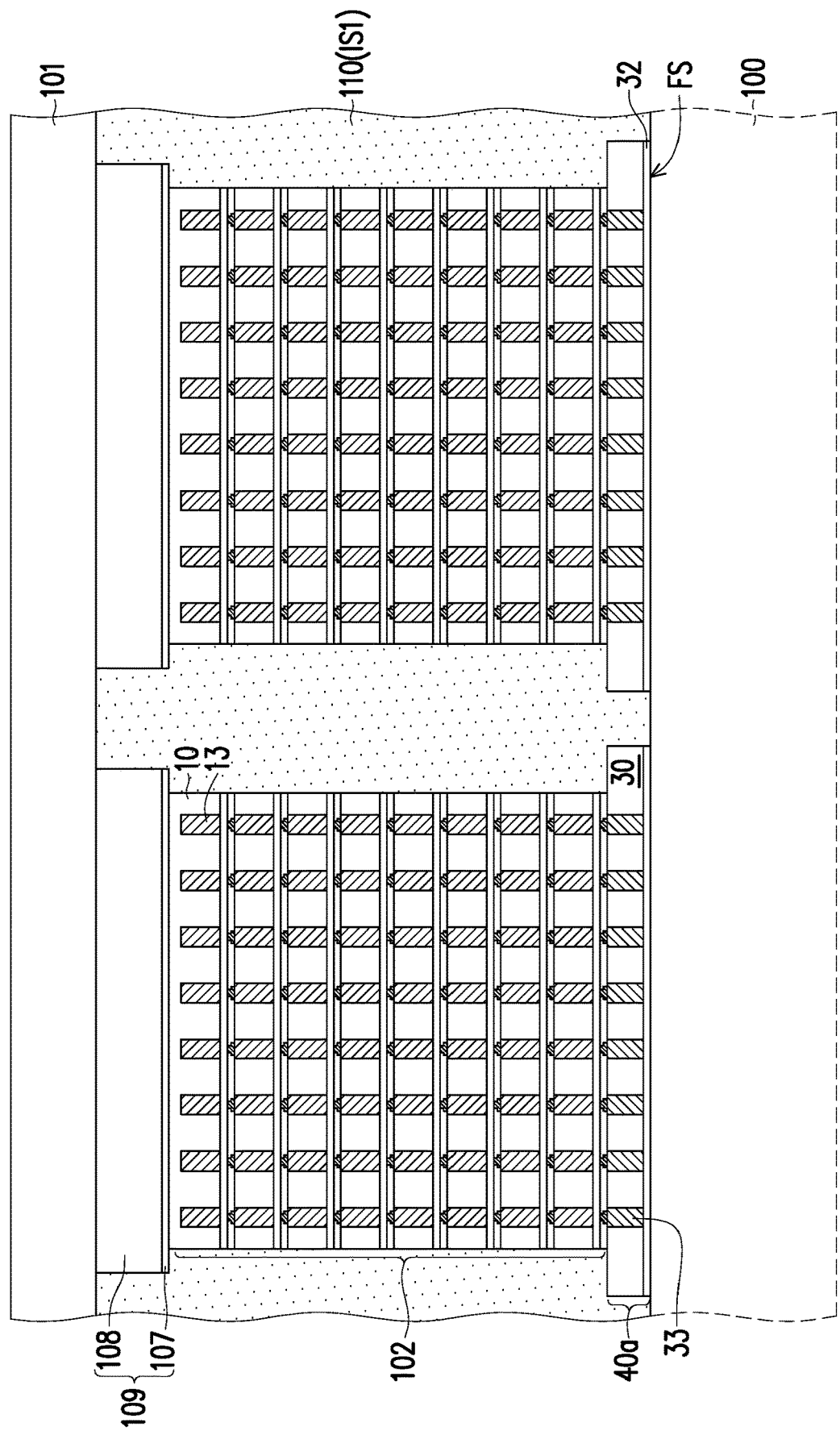
Figure 11F:
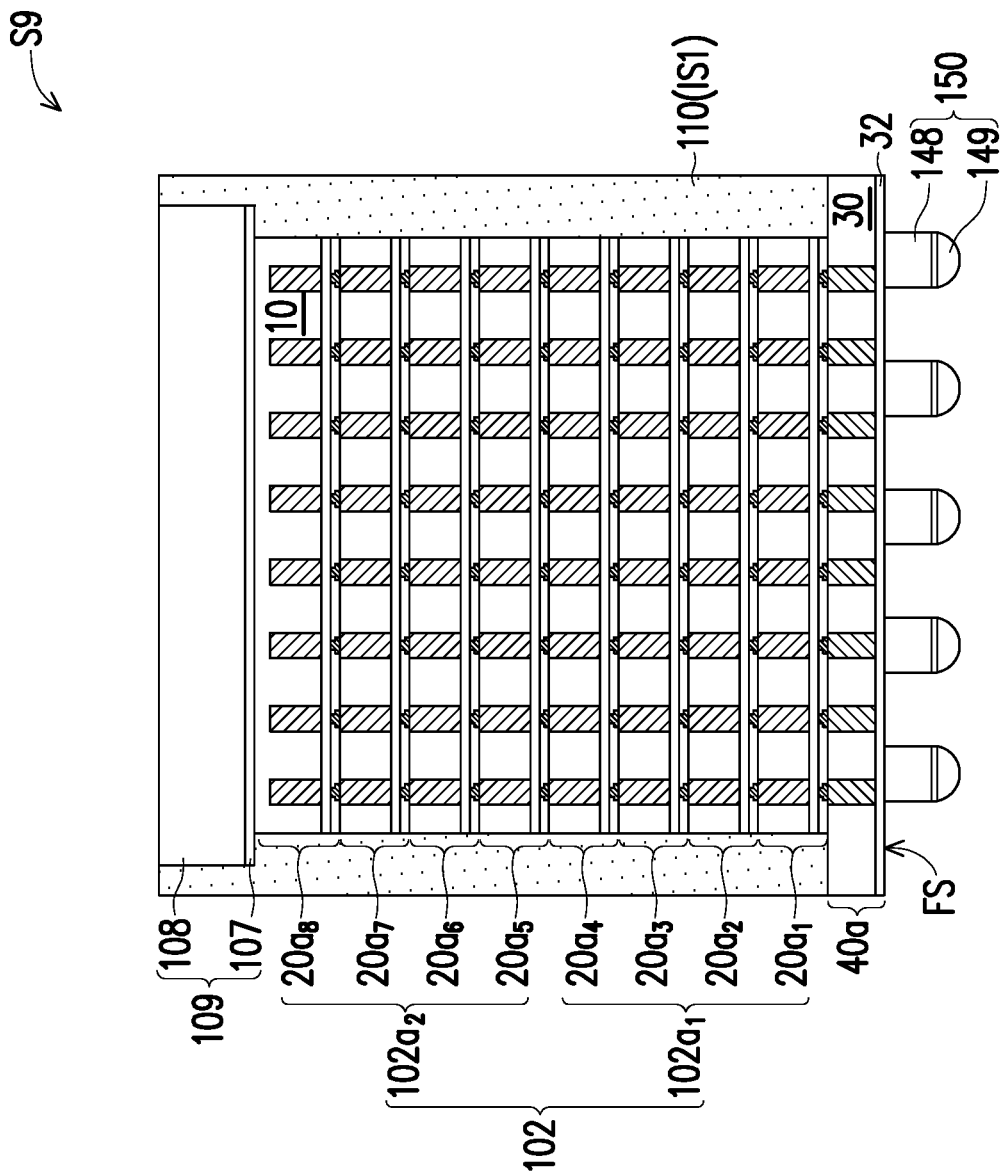

Referring to FIG. 11E and FIG. 11F, thereafter, process similar to those described in FIG. 4D and FIG. 4G are performed. For example, the insulating structure 110 is formed to laterally encapsulate the die 40a, the die stack structure 102 and the support structure 109. The carrier 101 may be attached to the support structure 109 and the insulating structure 110. The carrier 100 is then released from the overlying structure. Afterwards, the conductive terminals 150 are formed on the front side of the die 40a. The carrier 100 is then released, and a singulation process may be performed to singulate the semiconductor structures S9. The structure of the semiconductor structure S9 is similar to the semiconductor structure S1.

In the foregoing embodiments, the dies are bonded by hybrid bonding process and/or fusion bonding process, but the disclosure is not limited thereto. For example, FIG. 13 illustrates a semiconductor structure S10, in which the dies are bonded through connectors.

Figure 13:
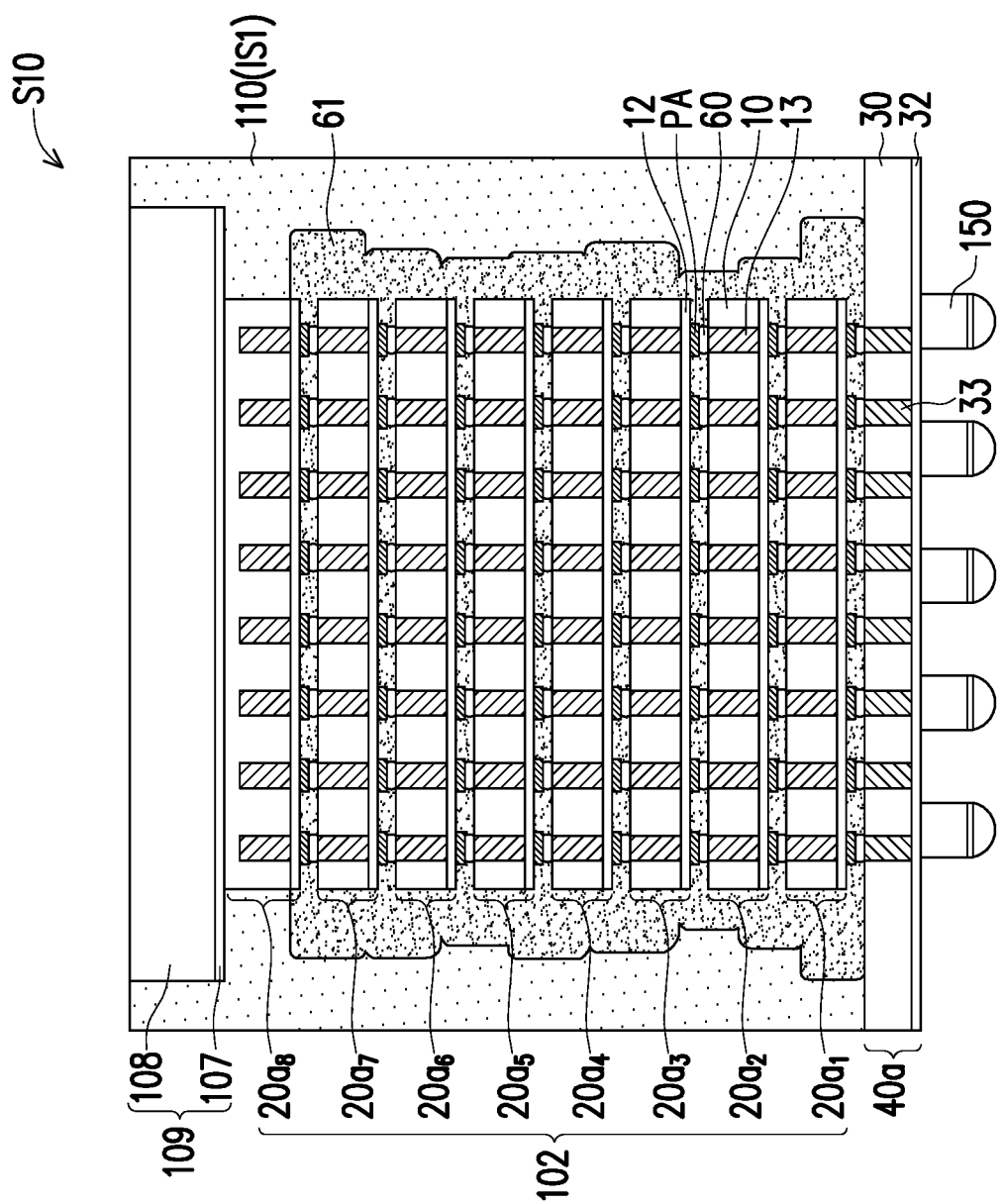
FIG. 13 is a schematic cross-sectional view illustrating a semiconductor structure according to some other embodiments of the disclosure.

Referring to FIG. 13, in some embodiments, the semiconductor structure S10 includes the die 40a, the die stack structure 102, the support structure 109, the underfill layer 61 and the insulation structure IS1. The dies 40a and $20a_1$-$20a_8$ are bonded to each other through the connectors 60. The connectors 60 may be micro bumps. In some embodiments, the connectors 60 may include solder bumps, silver bumps, copper bumps, or any other suitable metallic bumps. For example, the interconnection structures 12 of the dies $20a_1$-$20a_8$ may include a plurality of conductive pads PA which may be partially covered by a passivation layer (not shown). The conductive pads PA of the die $20a_1$ may be electrically connected to the conductive vias 33 of the die 40a through a plurality of connectors 60. The conductive pads PA of the one of the dies $20a_1$-$20a_8$ is electrically connected to the conductive vias 13 of another corresponding one of the dies $20a_1$-$20a_8$ through the connectors 60. The connectors 60 are located between the conductive vias 33 of the die 40a and the conductive pads PA of the die $20a_1$, and between the conductive vias 13 and the conductive pads PA of corresponding dies of the die stack structure 102, so as to provide the electrical connection.

In some embodiments, an underfill layer 61 is formed to fill the spaces between the adjacent dies by dispensing processes. For example, the underfill dispensing process may be performed after each of the die bonding process, and the underfill material dispensed to fill the space between two dies at a higher height level may flow to cover sidewalls of the dies at lower height level. The thicknesses of the underfill layer 61 covering sidewalls of different dies may be not uniform. The support structure 109 is bonded to the topmost die through a fusion bonding process. An insulation structure, such as the insulation structure IS1 including the encapsulant 110 laterally encapsulating the underfill layer 61, the die $20a_8$ and the support structure 109. In some embodiments, other kinds of insulation structures, such as the insulation structures including dielectric structure and/or encapsulant described above and the isolation layers may also be applied in the present embodiment In some embodiments, the semiconductor structures S1-S10 may be subject to further packaging process, and may further be coupled to other packaging components. For example, the semiconductor structures S1-S10 may further be integrated in a fan-out package structure, chip-on-wafer (CoW) package, chip-on-wafer-on-substrate (CoWoS) package, or the like. The packages including the semiconductor structures S1-S10 may be a part of an electronic system for such as computers (e.g., high-performance computer), computational devices used in conjunction with an artificial intelligence system, wireless communication devices, computer-related peripherals, entertainment devices, etc. The packages including the semiconductor structure(s) discussed herein may provide high bandwidth data communication. It should be noted that other electronic applications are also possible.

Figure 14:
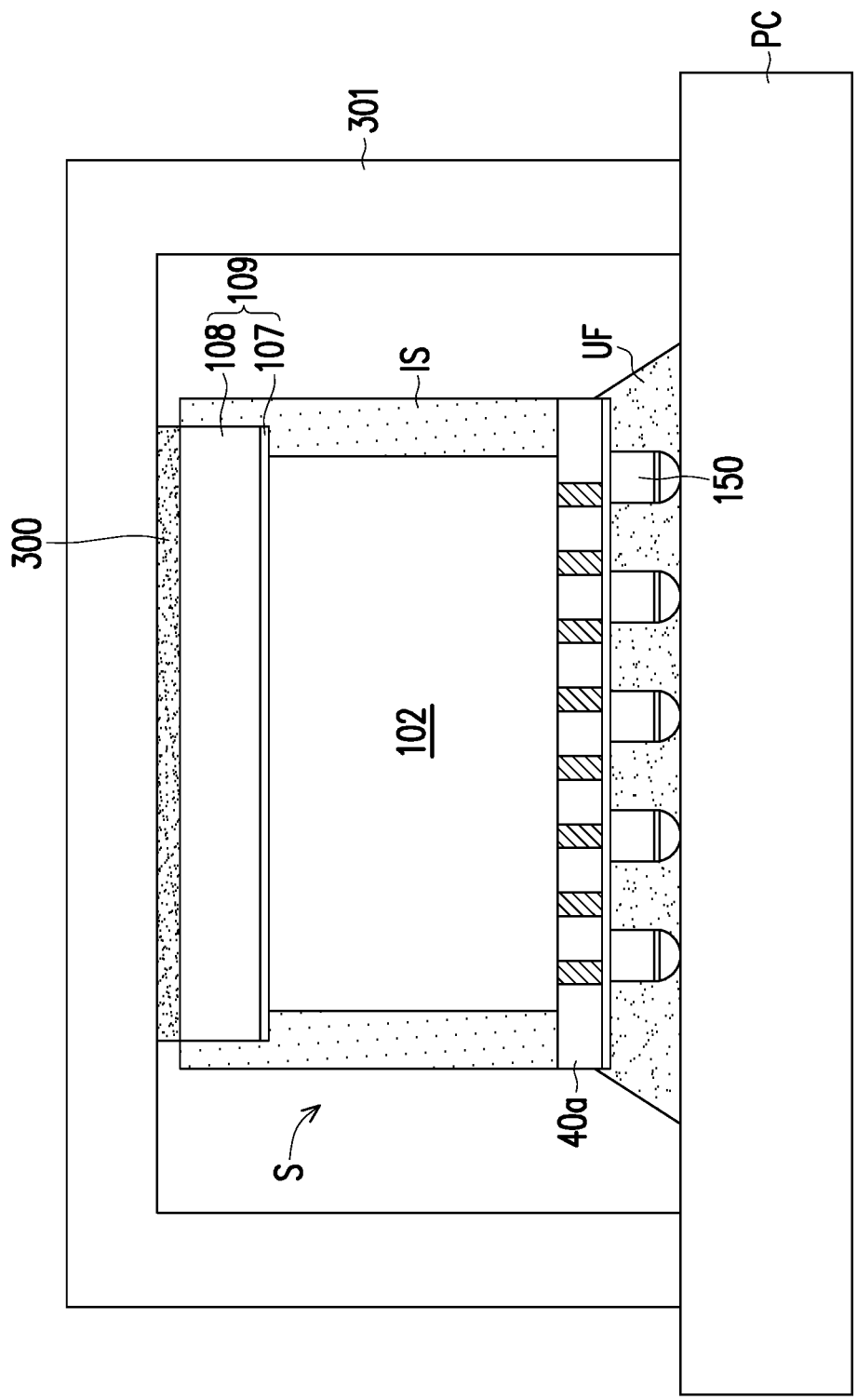
FIG. 14 is a schematic cross-sectional view illustrating an application of a semiconductor structure according to some embodiments of the disclosure.

For example, referring to FIG. 14, in some embodiments, a semiconductor structure S is provided. The semiconductor structure S may be one of the semiconductor structures S1-S10 described above. The semiconductor structure S includes the die 40a, the die stack structure 102, the support structure 109, and an insulation structure IS at least wrapping around the die stack structure 102 and the support structure 109. The insulation structure IS may be one of the insulation structures IS1-IS4 described above. It should be understood that the specific structure of the die stack structure 102 is not shown for the sake of brevity.

In some embodiments, the semiconductor structure S may be electrically coupled to a package component PC through the conductive terminals 150. The package component PC may be or may include an interposer, a package substrate, a printed circuit board (PCB), a printed wiring board, and/or other suitable packaging component. An underfill layer UF may fill the space between the semiconductor structure S and the package component PC.

In some embodiments, a lid 301 may be disposed on the semiconductor structure S, and a thermal interface material (TIM) 300 may be disposed between the semiconductor structure S and the lid 301. In some embodiments, the lid 301 is a thermal dissipation lid having a high thermal conductivity. Accordingly, the heat generated by the semiconductor structure S may dissipate to the lid 301, and then dissipate to the external environment. For example, the lid 301 may include a metal or a metal alloy, with the respective metals selected from the group consisting of Al, Cu, Ni, Co, the like or combinations thereof. The lid 301 may also be formed of a composite material selected from the group including silicon carbide, aluminum nitride, graphite, and the like. The TIM 300 has a good thermal conductivity. In some embodiments, the TIM 300 is made of silicones, which are polymers including silicon, carbon, hydrogen, oxygen and sometimes other elements. Alternatively, the TIM 300 may also be made of other materials, such as alumina ($Al_2O_3$) or zinc oxide ($ZnO_2$) mixed with silicone ($[R_2SiO]_n$) and other applicable materials.

In some embodiments, the TIM 300 may be dispensed on the support structure 109 of the semiconductor structure S. For example, the top surface of the substrate 108 of the support structure 109 may be covered (e.g. completely covered) by TIM 300. After the TIM 300 is applied on the semiconductor structure S, the lid 301 is mounted on the semiconductor structure S. During the mounting of the lid 301, the TIM 300 may be squeezed and extend to cover a portion of the top surface of the insulation structure IS. In some embodiments, the lid 301 may also land on the package component PC.

In some embodiments, after the lid 301 is mounted on the semiconductor structure S1, a fan or a heat sink (not shown) may further be mounted onto the lid 301 through another TIM to help the dissipation of heat generated by the semiconductor structure S.

In the embodiments of the disclosure, since the support structure 109 is formed on the die stack structure 102, the support structure 109 may serve as a buffer structure between the lid 301 and the die stack structure 102 to avoid the mechanical stress from the lid 301 and/or the heat sink or the fan directly applied on the die stack structure 102. Accordingly, the damage of the die stack structure 102 which may be caused by the stress directly from the lid 301 is thus avoided. On the other hand, the support structure 109 has a good thermal conductivity and may also serve as a thermal dissipation structure to help dissipate the heat generated by the die stack structure 102 and the die 40a to the lid 301. In other words, the configuration of the support structure improves the mechanical performance and the thermal dissipation performance of the semiconductor structure.

In accordance with some embodiments of the disclosure, a package structure includes a first die, a die stack structure, a support structure and an insulation structure. The die stack structure is bonded to the first die. The support structure is disposed on the die stack structure. A width of the support structure is larger than a width of the die stack structure and less than a width of the first die. The insulation structure at least laterally wraps around the die stack structure and the support structure.

In accordance with alternative embodiments of the disclosure, a package structure includes a first die, at least one second die and a dummy die structure. The first die laterally extends beyond a sidewall of the at least one second die. The dummy die structure is bonded to the at least one second die. A sidewall of the first die, the sidewall of the at least one second die and a sidewall of the dummy die structure are laterally offset from each other.

In accordance with some embodiments of the disclosure, a method of forming a package structure includes the following processes. A first die is provided. A die stack structure is bonded to the first die. The die stack structure includes at least one second die. A support structure is bonded to the die stack structure through a fusion bonding process. A width of the support structure is larger than a width of the die stack structure and less than a width of the first die. An insulation structure is formed to laterally wrap around the support structure and the die stack structure. At least a portion of the insulation structure is formed after bonding the support structure to the die stack structure.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A package structure, comprising:
a first die;
a die stack structure bonded to the first die;
a support structure, disposed on the die stack structure, wherein a width of the support structure is larger than a width of the die stack structure and less than a width of the first die; and
an insulation structure, at least laterally wrapping around the die stack structure and the support structure.

2. The package structure of claim 1, wherein a fusion bonding interface is between the support structure and the die stack structure.

3. The package structure of claim 2, wherein the fusion bonding interface is further existed between the support structure and a dielectric layer of the insulation structure.

4. The package structure of claim 1, wherein a top surface of the insulation structure is coplanar with a top surface of the support structure.

5. The package structure of claim 1, wherein the insulation structure comprises a first insulation structure and a second insulation structure on the first insulation structure, and the first insulation structure and the second insulation structure comprise different materials.

6. The package structure of claim 5, wherein a coefficient of thermal expansion (CTE) of the first insulation structure is less than a CTE of the second insulation structure and closer to a CTE of substrates of the die stack structure.

7. The package structure of claim 1, further comprising an isolation layer disposed between two adjacent dies of the die stack structure, wherein the isolation layer further extends to be underlying the insulation structure or extends into the insulation structure.

8. The package structure of claim 1, further comprising a lid disposed over the die stack structure, wherein the support structure is located between the lid and the die stack structure and is configured to buffer stress and dissipate heat.

9. The package structure of claim 1, wherein a topmost die of the die stack structure comprises a rounding corner, and a gap is vertically between a bottom surface of the support structure and the rounding corner of the topmost die.

10. A package structure, comprising:
a first die;
at least one second die bonded to the first die, wherein the first die laterally extends beyond a sidewall of the at least one second die; and
a dummy die structure, bonded to the at least one second die,
wherein a sidewall of the first die, the sidewall of the at least one second die and a sidewall of the dummy die structure are laterally offset from each other.

11. The package structure of claim 10, further comprising an encapsulant, at least laterally encapsulating the dummy die structure.

12. The package structure of claim 11, further comprising a dielectric structure between the encapsulant and the first die and laterally covering the at least one second die.

13. The package structure of claim 10, further comprising a plurality of dielectric layers laterally wrapping around the at least one second die and the dummy die structure.

14. The package structure of claim 10, wherein a substrate of the dummy die structure has a Young's modulus less than or equal to a Young's modulus of a substrate of the at least one second die, and a thermal conductivity of the substrate of the dummy die structure is larger than or equal to a thermal conductivity of the substrate of the at least one second die.

15. The package structure of claim 10, wherein the dummy die structure comprises a plurality of dummy die partitions laterally spaced from each other.

16. A method of forming a package structure, comprising:
providing a first die;
bonding a die stack structure to the first die, wherein the die stack structure comprises at least one second die;
bonding a support structure to the die stack structure by a fusion bonding process, wherein a width of the support structure is larger than a width of the die stack structure and less than a width of the first die; and
forming an insulation structure to laterally wrap around the support structure and the die stack structure, wherein at least a portion of the insulation structure is formed after bonding the support structure to the die stack structure.

17. The method of claim 16, wherein the insulation structure comprises an encapsulant, and forming the encapsulant comprises:
forming an encapsulant material layer to encapsulate sidewalls of the die stack structure, and sidewalls and a top surface of the support structure after bonding the support structure to the die stack structure; and
performing a planarization process on the encapsulant material layer, so as to form an encapsulant laterally encapsulating the die stack structure and the support structure.

18. The method of claim 17, wherein the insulation structure further comprises a dielectric layer underlying the encapsulant, wherein before forming the encapsulant material layer, forming the dielectric layer laterally wrapping around the die stack structure comprises:
bonding a second die to the first die;
forming a dielectric material layer on the first die and laterally aside the second die; and
performing a planarization process on the dielectric material layer to form a dielectric layer laterally aside the second die; and
bonding a plurality of other second dies on the second die, the second die and the plurality of other second dies constituting the die stack structure.

19. The method of claim 16, wherein the insulation structure comprises a plurality of dielectric layers, and forming the die stack structure, the support structure and the insulation structure comprises:
bonding a second die to the first die;
forming a first dielectric layer on the first die and laterally aside the second die;
bonding another second die to the second die;
forming a second dielectric layer on the first dielectric layer and laterally aside the another second die;
bonding the support structure to the another second die and the second dielectric layer through a fusion bonding process; and
forming a third dielectric layer on the second dielectric layer and laterally aside the support structure.

20. The method of claim 16, wherein the at least one second die comprises a plurality of second dies, the first die and the plurality of second dies are stacked on one another in a face-to-back configuration, face-to-face configuration or back-to-back configuration.

* * * * *